(12) United States Patent
Uezawa et al.

(10) Patent No.: US 9,627,653 B2
(45) Date of Patent: Apr. 18, 2017

(54) ORGANIC ELECTROLUMINESCENCE ELEMENT AND PLANAR LIGHT-EMITTING BODY EACH HAVING LIGHT EXTRACTION SHEET

(71) Applicant: Konica Minolta, Inc., Tokyo (JP)

(72) Inventors: Kuniaki Uezawa, Hamura (JP); Masakazu Tonishi, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/355,055

(22) PCT Filed: Oct. 3, 2012

(86) PCT No.: PCT/JP2012/075690
§ 371 (c)(1),
(2) Date: Apr. 29, 2014

(87) PCT Pub. No.: WO2013/073301
PCT Pub. Date: May 23, 2013

(65) Prior Publication Data
US 2014/0264317 A1    Sep. 18, 2014

(30) Foreign Application Priority Data
Nov. 14, 2011    (JP) ................. 2011-248367

(51) Int. Cl.
*H01L 51/52* (2006.01)
*G02B 5/02* (2006.01)
(Continued)

(52) U.S. Cl.
CPC .......... *H01L 51/5275* (2013.01); *G02B 5/021* (2013.01); *H01L 51/0096* (2013.01);
(Continued)

(58) Field of Classification Search
CPC ........................... H01L 27/32; H01L 27/3206
See application file for complete search history.

(56) References Cited

U.S. PATENT DOCUMENTS

2005/0068628 A1* 3/2005 Masaki ............... G02B 5/0226
359/599
2006/0257678 A1    11/2006 Benson, Jr. et al.
(Continued)

FOREIGN PATENT DOCUMENTS

EP          1933080 A1    6/2008
JP       2000298203 A    10/2000
(Continued)

OTHER PUBLICATIONS

ISO 14782:1999, International Organization for Standarization: International Standards for Business, Government and Society (2009), pp. 1-2. Retrived online on Feb. 20, 2015—http://www.iso.org/iso/catalogue_detail.htm?csnumber=25544.*
(Continued)

*Primary Examiner* — Michael Jung
(74) *Attorney, Agent, or Firm* — Lucas & Mercanti, LLP

(57) ABSTRACT

Provided is an organic EL element having both excellent light extraction efficiency and excellent weather resistance. The organic EL element (10) has a configuration comprising: an organic EL element main body (1) including an organic compound layer (13) including a light-emitting layer; and a light extraction sheet (2) provided on the light-extraction side of the organic EL element main body (1). In addition, the organic EL element (10) is characterized by: the light extraction sheet (2) including a silicon compound; the haze value of the light extraction sheet (2) being at least 90; and the total light transmittance of the light extraction sheet (2) being at least 80%.

9 Claims, 5 Drawing Sheets

| LIGHT EXTRACTION SHEET NO. | 1 | 2 | 3 | 4 | 5 | 6 | 7 | 8 | 9 |
|---|---|---|---|---|---|---|---|---|---|
| HAZE VALUE | 85 | 92 | 82 | 92 | 92 | 93 | 94 | 96 | 90 |
| TOTAL LIGHT TRANSMITTANCE (%) | 75 | 71 | 83 | 85 | 86 | 85 | 85 | 82 | 80 |

(51) Int. Cl.
*H01L 51/00* (2006.01)
*H01L 27/32* (2006.01)
*H01L 51/50* (2006.01)

(52) U.S. Cl.
CPC ...... *H01L 51/5262* (2013.01); *H01L 51/5265* (2013.01); *H01L 51/5268* (2013.01); *H01L 27/32* (2013.01); *H01L 27/3206* (2013.01); *H01L 51/504* (2013.01); *H01L 51/5036* (2013.01); *Y02E 10/549* (2013.01)

(56) References Cited

U.S. PATENT DOCUMENTS

| | | | |
|---|---|---|---|
| 2008/0008845 A1* | 1/2008 | Oh | C08J 7/042 428/1.3 |
| 2008/0310171 A1* | 12/2008 | Hiraishi | G02B 5/0231 362/339 |
| 2009/0214828 A1 | 8/2009 | Watkins et al. | |
| 2010/0150513 A1 | 6/2010 | Zhang et al. | |
| 2011/0018431 A1 | 1/2011 | Watanabe | |
| 2012/0080710 A1* | 4/2012 | Inoue et al. | 257/98 |
| 2012/0194065 A1* | 8/2012 | Aoki | H01L 51/5268 313/504 |
| 2012/0200221 A1* | 8/2012 | Inoue | 313/504 |
| 2012/0200929 A1* | 8/2012 | Lu | G02B 5/0221 359/599 |
| 2012/0261701 A1* | 10/2012 | Yoo | H01L 51/5275 257/98 |
| 2012/0292652 A1 | 11/2012 | Yamae et al. | |
| 2013/0168712 A1* | 7/2013 | Jeong | H01L 51/5275 257/98 |
| 2014/0203700 A1* | 7/2014 | Inada | G02B 5/0252 313/116 |

FOREIGN PATENT DOCUMENTS

| | | | |
|---|---|---|---|
| JP | 2003109747 A | 4/2003 | |
| JP | 2009238694 A | 10/2009 | |
| JP | 2011018583 A | 1/2011 | |
| JP | 2011228262 A | 11/2011 | |
| JP | 2011248104 A | 12/2011 | |
| WO | 0114050 A1 | 3/2001 | |
| WO | 2006122131 A1 | 11/2006 | |
| WO | WO2010/143705 A1 * | 12/2010 | ............... F21S 2/00 |
| WO | 2011046190 A1 | 4/2011 | |
| WO | 2011105141 A1 | 9/2011 | |
| WO | 2011148823 A1 | 12/2011 | |

OTHER PUBLICATIONS

European Search Report; Application No. 12849338.4-1552/2782417; Issued Jul. 7, 2015; Applicant: Konica Minolta, Inc.; total of 9 pages.
EP Search Report dated Aug. 23, 2016 from the corresponding European Application; Application No. 12 849 338.4-1552; Applicant: Konica Minolta, Inc.; Total of 5 pages.
Notification of Reasons for Refusal dated May 17, 2016; Patent Application No. JP2013-544176; English translation of Notification of Reasons for Refusal; Total of 13 pages.

* cited by examiner

| LIGHT EXTRACTION SHEET NO. | 1 | 2 | 3 | 4 | 5 | 6 | 7 | 8 | 9 |
|---|---|---|---|---|---|---|---|---|---|
| HAZE VALUE | 85 | 92 | 82 | 92 | 92 | 93 | 94 | 96 | 90 |
| TOTAL LIGHT TRANSMITTANCE (%) | 75 | 71 | 83 | 85 | 86 | 85 | 85 | 82 | 80 |

FIG. 5

| SAMPLE | COMPARATIVE EXAMPLE 1-1 | COMPARATIVE EXAMPLE 1-2 | COMPARATIVE EXAMPLE 1-3 | COMPARATIVE EXAMPLE 1-4 | EXAMPLE 1-1 | EXAMPLE 1-2 | EXAMPLE 1-3 | EXAMPLE 1-4 | EXAMPLE 1-5 | EXAMPLE 1-6 |
|---|---|---|---|---|---|---|---|---|---|---|
| ORGANIC EL ELEMENT SUBSTRATE | GLASS 0.7mm | GLASS 0.7mm | GLASS 0.7mm | GLASS 0.7mm | GLASS 0.7mm | GLASS 0.7mm | GLASS 0.7mm | GLASS 0.7mm | GLASS 0.7mm | GLASS 0.7mm |
| LIGHT EXTRACTION SHEET No. | — | 1 | 2 | 3 | 4 | 5 | 6 | 7 | 8 | 9 |
| BASE MATERIAL | — | PET | PET | PET | PET | POLYCARBONATE | POLYCARBONATE | POLYCARBONATE | POLYCARBONATE | PET |
| ADDITION COMPOUND | — | SILICA RESIN | SILICA RESIN | SILICA RESIN | SILICON COMPOUND | SILICON COMPOUND | SILICON COMPOUND + PMMA | SILICON COMPOUND + PMMA + BROMINE-CONTAINING COMPOUND | SILICON COMPOUND + PMMA + BROMINE-CONTAINING COMPOUND | SILICON COMPOUND |
| SURFACE TREATMENT | — | — | — | — | — | — | — | — | CONCAVE-CONVEX SHAPE | — |
| HAZE VALUE | — | 85 | 92 | 82 | 92 | 92 | 93 | 94 | 96 | 90 |
| TOTAL LIGHT TRANSMITTANCE | — | 75% | 71% | 83% | 85% | 86% | 85% | 85% | 82% | 80% |
| LUMINANCE | 600 | 800 | 730 | 820 | 900 | 940 | 920 | 950 | 1000 | 810 |
| LIGHT EXTRACTION EFFICIENCY | 1.00 | 1.33 | 1.22 | 1.37 | 1.50 | 1.57 | 1.53 | 1.58 | 1.67 | 1.35 |
| LUMINANCE AFTER HIGH TEMPERATURE AND HIGH HUMIDITY | 580 | 680 | 640 | 730 | 880 | 925 | 910 | 920 | 970 | 740 |
| RATE OF DECREASE IN LUMINANCE | 97% | 85% | 88% | 89% | 98% | 98% | 99% | 97% | 97% | 92% |
| YELLOWING | OK | NG | NG | NG | OK | OK | OK | OK | OK | OK |

FIG. 6

| SAMPLE | COMPARATIVE EXAMPLE 2-1 | COMPARATIVE EXAMPLE 2-2 | COMPARATIVE EXAMPLE 2-3 | EXAMPLE 1-5 | EXAMPLE 2-1 | EXAMPLE 2-2 | EXAMPLE 2-3 | EXAMPLE 2-4 | EXAMPLE 2-5 | EXAMPLE 2-6 |
|---|---|---|---|---|---|---|---|---|---|---|
| ORGANIC EL ELEMENT SUBSTRATE | PEN | PEN | PET | GLASS 0.7mm | PEN | PET | POLYIMIDE | GLASS 0.4mm | GLASS 0.2mm | METAL FOIL |
| LIGHT EXTRACTION SHEET No. | — | 1 | 1 | 8 | 8 | 8 | 8 | 8 | 8 | 8 |
| LUMINANCE | 550 | 700 | 750 | 1000 | 850 | 860 | 840 | 1100 | 1150 | 940 |
| LIGHT EXTRACTION EFFICIENCY | 1.00 | 1.27 | 1.32 | 1.67 | 1.49 | 1.49 | 1.52 | 1.80 | 1.87 | 1.59 |
| LUMINANCE AFTER HIGH TEMPERATURE AND HIGH HUMIDITY | 520 | 600 | 620 | 970 | 800 | 810 | 805 | 1050 | 1100 | 920 |
| RATE OF DECREASE IN LUMINANCE | 95% | 86% | 83% | 97% | 94% | 94% | 96% | 95% | 96% | 98% |
| YELLOWING | OK | NG | NG | OK | OK | OK | OK | OK | OK | OK |

FIG. 7

| SAMPLE | COMPARATIVE EXAMPLE 2-1 | COMPARATIVE EXAMPLE 2-2 | COMPARATIVE EXAMPLE 2-3 | EXAMPLE 1-5 | EXAMPLE 2-1 | EXAMPLE 2-2 | EXAMPLE 2-3 | EXAMPLE 2-4 | EXAMPLE 2-5 | EXAMPLE 2-6 |
|---|---|---|---|---|---|---|---|---|---|---|
| ORGANIC EL ELEMENT SUBSTRATE | PEN | PEN | PET | GLASS 0.7mm | PEN | PET | POLYIMIDE | GLASS 0.4mm | GLASS 0.2mm | METAL FOIL |
| LIGHT EXTRACTION SHEET No. | — | 1 | 1 | 8 | 8 | 8 | 8 | 8 | 8 | 8 |
| FLAME RETARDANCE | NG | NG | NG | OK | OK | OK | OK | OK | OK | OK |

ORGANIC ELECTROLUMINESCENCE ELEMENT AND PLANAR LIGHT-EMITTING BODY EACH HAVING LIGHT EXTRACTION SHEET

CROSS REFERENCE TO RELATED APPLICATION

This Application is a 371 of PCT/JP2012/075690 filed on Oct. 3, 2012 which, in turn, claimed the priority of Japanese Patent Application No. JP2011-248367 filed on Nov. 14, 2011 both applications are incorporated herein by reference.

TECHNICAL FIELD

The present invention relates to an organic electroluminescence element applicable to applications such as a display device and a lighting device, and relates to a planar light-emitting body produced by arranging a plurality of the organic electroluminescence elements.

BACKGROUND ART

In recent years, a planar light-emitting body to be used as backlight of various displays, display panels of sign boards and emergency light, lighting devices and the like has been drawing attention because it has many excellent characteristics such as high luminance, high efficiency, thin type and lightness in weight. As one of the planar light-emitting bodies, there is an organic electroluminescence element (hereinafter, referred to as organic EL element), which emits light by supplying electric energy to a light-emitting layer formed of an organic material from respective positive and negative electrodes. The organic EL element particularly draws attention for the reason that it can emit light with a low voltage of about several volts to several ten volts, and that space saving can be achieved because it is a thin film-type complete solid element.

The organic EL element includes, generally, a transparent substrate, a first electrode, a light-emitting layer and a second electrode, and the first electrode, the light-emitting layer and the second electrode are formed on the transparent substrate in this order. In the organic EL element of the configuration, when a voltage is applied between the first electrode and the second electrode, holes are injected into the light-emitting layer from one electrode and electrons are injected into the light-emitting layer from the other electrode. Subsequently, holes and electrons injected in the light-emitting layer recombine in the light-emitting layer, and thus light is emitted. Then, light emitted from the light-emitting layer (hereinafter, referred to as emitted light) passes through the first electrode and the transparent substrate, and a user recognizes that the organic EL element emits light. Meanwhile, the light-emitting layer includes one or a plurality of organic compound layers containing an organic light-emitting substance (light-emitting material), and depending on the kind of the organic light-emitting substance to be added, the wavelength of the emitted light can be varied.

Meanwhile, when the planar light-emitting body is used as a light source of a lighting device or the like, extraction of white light is required. In the organic EL element, as techniques for obtaining white light, there are techniques to stack a plurality of light-emitting layers each containing a light-emitting material that emits light having wavelengths different from each other, and techniques to mix a plurality of light-emitting materials each emits light having wavelengths different from each other in one light-emitting layer. When such a technique is used, emitted light from each light-emitting material is mixed and white light is obtained. Meanwhile, in the technique, by changing suitably the kind of the light-emitting material to be used, light of various colors can be extracted, in addition to white light.

However, in the case of a planar light-emitting element constituted by a thin film such as an organic EL element, the light emitted from the light-emitting layer does not have directivity. Therefore, among the emitted light, a light component having an emission angle of a critical angle or more, of the light, which is determined by the refractive index of a thin-film layer including the light-emitting layer and the refractive index of a medium through which the emitted light passes at the time of light emission, is totally reflected at the interface of the medium and is confined inside the organic EL element and serves as guided light that propagates through the inside. That is, there occurs a problem in which light components having emission angles of less than the critical angle can be extracted outside among the light generated in the light-emitting layer, but that other light components are lost to lower a light extraction efficiency (a ratio of the energy of light emitted outside through the transparent substrate relative to the energy of the emitted light).

Here, the above-mentioned problem of the light extraction efficiency will be explained more specifically. When the light extraction efficiency (light-emitting efficiency) was derived by applying the analysis of a multiple reflection phenomenon based on the classic optics, to an organic EL element in which the refractive index of a light-emitting layer is n, the light extraction efficiency can be approximated by $1/(2n^2)$, and is almost determined by the refractive index n of the light-emitting layer. When calculating simply the light extraction efficiency of the organic EL element on the basis of the approximation, assuming that the refractive index n of the light-emitting layer is about 1.7, the light extraction efficiency of the organic EL element is about 20%. Therefore, remaining light of about 80% propagates into the direction inside the plane of the light-emitting layer (disappearance in the lateral direction), or disappears at a metal electrode (cathode) provided in a position facing the transparent electrode (anode) with the light-emitting layer interposed (absorption backward). That is, in organic EL elements, among light generated inside the layer (the refractive index is about 1.7 to 2.1) having a refractive index higher than that of the air, light of only about 15% to 20% can be extracted outside.

Therefore, conventionally, there are proposed various technologies to improve the light extraction efficiency in organic EL elements. Specifically, there are proposed techniques such as introducing, between a substrate and a light-emitting body, a flat layer having a refractive index that lies midway between refractive indices of both, to thereby achieve antireflection, and forming a light diffusion layer containing a binder and a filler on the surface of the substrate, to thereby inhibit the total reflection of the emitted light through the utilization of the scattering effect of the light diffusion layer. Furthermore, conventionally, there is also proposed a technique of inhibiting the total reflection at the interface between the transparent substrate and the air by forming a prism sheet or a microarray lens on the surface of a transparent substrate to thereby provide a concave-convex shape such as a prism shape or a lens shape on the surface of the transparent substrate (for example, see Patent Literature 1). Moreover, conventionally, there is also proposed a technique of improving the light-emitting efficiency itself of the light-emitting layer by devising the configuration of the light-emitting layer (such as making the thickness of the light-emitting layer larger).

CITATION LIST

Patent Literature

PTL1; Japanese Patent Laid-Open No. 2011-18583

SUMMARY OF INVENTION

Technical Problem

As described above, in organic EL elements, various techniques for improving the light extraction efficiency are proposed, and for example, in a technique of introducing a flat layer having an intermediate refractive index between a substrate and a light-emitting body, and in a technique of fabricating a light diffusion layer having a scattering effect on the surface of the substrate or the like, the total reflection of emitted light at an interface between layers can be reduced. However, even when these techniques are used, since a flat interface exists at a light extraction surface of an organic EL element, the total reflection of the emitted light may occur at the interface between the flat surface and the air. That is, in such conventional techniques as described above, sufficient improvement of the extraction efficiency of light is difficult.

On the other hand, in a technique using a light-diffusing sheet provided with a concave-convex shape on the surface thereof for satisfying both a light diffusion function and a lens function, a smooth interface can be eliminated at the interface between the light extraction surface and the air, and thus it is useful as a technique for preventing the total reflection of emitted light at the interface between the light extraction surface and the air. However, such a light-diffusing sheet is insufficient, for example, in weather resistance against heat or light, and in particular, when the light-diffusing sheet is used in a lighting device for outdoor applications, the luminance may be lowered by the change in color of the light-diffusing sheet (light extraction sheet).

The present invention has been made in light of the situation, and a purpose of the present invention is to provide an organic EL element having both excellent light extraction efficiency and excellent weather resistance, and a planar light-emitting body including the element.

Solution to Problem

In order to solve the above problems, the organic EL element of the present invention has a configuration including an organic electroluminescence element main body having an element substrate, a first electrode formed on the element substrate, an organic compound layer that is formed on the first electrode and includes a light-emitting layer and a second electrode formed on the organic compound layer, and a light extraction sheet provided on the light-extraction side of the organic electroluminescence element main body. In addition, in the organic EL element of the present invention, the light extraction sheet contains a silicon compound, the haze value of the light extraction sheet is 90 or more, and the value of the total light transmittance of the light extraction sheet is 80% or more.

Furthermore, the planar light-emitting body of the present invention has a configuration including a plurality of the organic EL elements of the above-mentioned present invention and a support member that supports the plurality of the organic EL elements of the present invention arranged in a prescribed form.

Advantageous Effects of Invention

As described above, in the organic EL element of the present invention, and in the planar light-emitting body including the same, the light extraction sheet including a silicon compound and having a haze value of 90 or more and the total light transmittance of 80% or more, is provided on the light-extraction side thereof. According to the present invention, by providing the light extraction sheet, it is possible to provide the organic EL element excellent in both light extraction efficiency and weather resistance, and the planar light-emitting body including the same.

BRIEF DESCRIPTION OF DRAWINGS

FIG. 5 is a diagram showing evaluation results regarding Example 1.

FIG. 6 is a diagram showing evaluation results regarding Example 2.

FIG. 7 is a diagram showing evaluation results regarding Example 3.

DESCRIPTION OF EMBODIMENTS

Hereinafter, an example of the organic EL element according to an embodiment of the present invention, and an example of the planar light-emitting body including the same will be explained specifically with reference to the drawings, but the present invention is not limited to examples below.

<1. Configuration of Organic EL Element>

[Whole Configuration of Organic EL Element]

Figure 1:
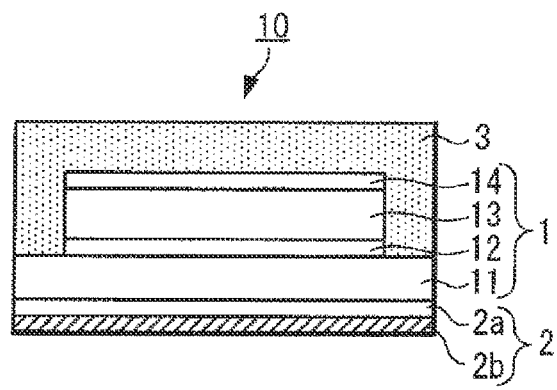
FIG. 1 is a schematic configuration sectional view of the organic EL element according to an embodiment of the present invention.

In FIG. 1, a configuration example of the organic EL element according to an embodiment of the present invention is shown. Meanwhile, FIG. 1 shows a schematic configuration sectional view of the organic EL element of the present embodiment.

An organic EL element 10 includes an organic EL element main body 1, a light extraction sheet 2 and a sealant 3. The organic EL element main body 1 includes an element substrate 11, an anode 12 (first electrode), an organic compound layer 13 and a cathode 14 (second electrode). Furthermore, in the present embodiment, the light extraction sheet 2 is provided on the surface opposite to the anode 12 side of the element substrate 11, and the sealant 3 is provided so as to cover the anode 12, the organic compound layer 13 and the cathode 14 of the organic EL element main body 1.

Meanwhile, as to the organic EL element 10 of the present embodiment, an example of extracting emitted light from the anode 12 side will be explained, but the present invention is not limited to this, and may have a configuration of extracting emitted light from the cathode 14 side, or from both the anode 12 side and the cathode 14 side. In this case, the light extraction sheet 2 may also be provided on the light extraction surface on the cathode 14 side of the organic EL element 10.

Moreover, the organic compound layer 13 is a layer including the light-emitting layer, and other than the light-emitting layer, includes various organic layers such as an injection layer, a blocking layer or a transport layer of carriers (holes and electrons), and is constituted by stacking these various organic layers.

Examples of preferable stacking of respective parts and respective layers constituting the organic EL element main body 1 are as follows.

(1) element substrate/anode/light-emitting layer/electron transport layer/cathode (2) element substrate/anode/hole transport layer/light-emitting layer/electron transport layer/cathode (3) element substrate/anode/hole transport layer/light-emitting layer/hole blocking layer/electron transport layer/cathode (4) element substrate/anode/hole transport layer/light-emitting layer/hole blocking layer/electron transport layer/electron injection layer (cathode buffer layer)/cathode (5) element substrate/anode/hole injection layer (anode buffer layer)/hole transport layer/light-emitting layer/hole blocking layer/electron transport layer/electron injection layer/cathode (6) element substrate/anode/hole injection layer/hole transport layer/light-emitting layer/electron transport layer/electron injection layer/cathode Hereinafter, configurations of respective parts and respective layers of the organic EL element 10 will be explained more specifically.

[Element Substrate]

The element substrate 11 (base body, substrate, base material, support) can be formed of, for example, a transparent material such as glass or plastic. In particular, preferably the element substrate 11 is constituted of a glass substrate, thin film glass, a quartz substrate or a transparent resin film.

It is possible to use, as the material for forming the transparent resin film, for example, polyester such as polyethylene terephthalate (PET) or polyethylene naphthalate (PEN). Furthermore, it is possible to use, as the material for forming the transparent resin film, for example, a material such as polyethylene, polypropylene or cellophane. Moreover, it is possible to use, as the material for forming the transparent resin film, cellulose esters such as cellulose diacetate, cellulose triacetate, cellulose acetate butyrate, cellulose acetate propionate (CAP), cellulose acetate phthalate (TAC) and cellulose nitrate, or derivatives thereof.

In addition, examples of the materials usable as the material for forming the transparent resin film include polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyether imide, polyether ketone imide, polyamide, fluororesin, nylon, polymethyl methacrylate, acrylic and polyacrylates. Furthermore, it is also possible to use a cycloolefin-based resin, for example, referred to as ARTON (registered trade mark: manufactured by JSR) or APEL (registered trade mark: manufactured by Mitsui Chemicals, Inc.), as a material for forming the transparent resin film.

When a polyimide film is used as the element substrate 11, any polyimide film can be used as the element substrate 11, as long as it is a nonthermoplastic polyimide film satisfying conditions that the storage modulus value is in the range of about 2 to 10 GPa and the thermal expansion coefficient value is in the range of about 0 to 6 ppm. Therefore, it is possible to use conventionally known polyimide films, as the element substrate 11, and to use commercially available polyimide films such as, for example, XENOMAX (registered trade mark: manufactured by Toyobo Seki Co., Ltd.) and Pomiran (registered trade mark) T (manufactured by Arakawa Chemical Industries, Ltd.). Meanwhile, it is possible to use, for example, conventionally known techniques that are described in Japanese Patent Laid-Open Nos. 05-70590, 2000-119419, 2007-56198 or 2005-68408, as a technique for producing a polyimide film.

When the element substrate 11 is constituted of a transparent resin film made of the above various materials, a film including an inorganic material, a film including an organic material or a hybrid film in which these films are stacked may be provided on the surface of the transparent resin film, in order to suppress the permeation of, for example, water vapor, oxygen or the like into the organic EL element 10. In this case, the above-mentioned film is preferably constituted of a barrier film that gives a value of a water vapor transmission rate (environmental conditions: 25±0.5° C., relative humidity (90±2)% RH) of about 0.01 g/[m$^2$·day·atm] or less. In addition, the above-mentioned film is more preferably constituted of a barrier film that gives a value of an oxygen transmission rate of about $10^{-3}$ cm$^3$/[m$^2$·day·atm] or less and a value of a water vapor transmission rate of about $10^{-3}$ g/[m$^2$·day·atm] or less. Furthermore, the above-mentioned film is particularly preferably constituted of a barrier film that gives a value of an oxygen transmission rate of about $10^{-3}$ cm$^3$/[m$^2$·day·atm] or less and a value of water vapor transmission rate of about $10^{-5}$ g/[m$^2$·day·atm] or less. Meanwhile, the "water vapor transmission rate" expressed in the present specification is a value measured by an infrared sensor method in accordance with JIS (Japanese Industrial Standards)-K7129 (1992), and the "oxygen transmission rate" is a value measured by a coulometric method in accordance with JIS-K7126 (1987).

Any material can be used as the material for forming the above-mentioned barrier film (above-mentioned coating film), as long as it is a material capable of suppressing permeation of factors such as moisture and oxygen, which causes the deterioration of the organic EL element 10, into the organic EL element 10. For example, the barrier film can be constituted of a coating film including an inorganic material such as silicon oxide, silicon dioxide, or silicon nitride. Meanwhile, in order to improve brittleness of the barrier film, the barrier film is preferably constituted of a hybrid coating film in which a coating film including the above-mentioned inorganic material and a coating film including an organic material are stacked. In this case, the coating film including the inorganic material and the coating film including an organic material are stacked in an arbitrary order, and the both films are preferably stacked alternately a plurality of times.

Any technique can be used as techniques for forming the barrier film, as long as it is a technique capable of forming the barrier film on the element substrate 11 (transparent resin film). Examples of usable techniques includes a vacuum evaporation method, a sputtering method, a reactive sputtering method, a molecular beam epitaxial method, a cluster ion beam method, an ion plating method, a plasma polymerization method, an atmospheric pressure plasma polymerization method (see Japanese Patent Laid-Open No. 2004-68143), a plasma CVD (Chemical Vapor Deposition) method, a laser CVD method, a thermal CVD method, a coating method and the like. Meanwhile, in the present embodiment, in particular, the use of the atmospheric pressure plasma polymerization method is preferable.

Furthermore, in the present embodiment, the element substrate 11 may be constituted of metal foil. It is possible to use a metal foil such as, for example, aluminum foil, copper foil, stainless steel foil, gold foil or silver foil, as the metal foil. Meanwhile, the thickness of the metal foil is preferably set to be a value in the range of about 10 to 100 µm.

Furthermore, when metal foil is used as the element substrate 11, an insulating layer is preferably provided on one side or both sides of the metal foil. The insulating layer can be formed of an inorganic material such as an inorganic oxide or inorganic nitride, polyester such as polyethylene terephthalate, polybutylene phthalate or polyethylene naphthalate, polystyrene, polycarbonate, polyether sulfone, polyacrylate, allyl diglycol carbonate, polyimide, polycycloolefin, norbornene resin, poly(chlorotrifluoroethylene) or polyimide.

When an inorganic insulating layer is used as the insulating layer, preferably the inorganic insulating layer, for example, constituted of a metal oxide film including silicon oxide, germanium oxide, zinc oxide, aluminum oxide, titanium oxide or copper oxide, or of a metal nitride film including silicon nitride, germanium nitride or aluminum nitride. Furthermore, the insulating layer may be formed by combination of one kind or two or more kinds from these various inorganic films. Meanwhile, the thickness of the inorganic insulating layer is preferably set to be a value in the range of about 10 to 100 nm. Furthermore, as a technique for forming the insulating layer including metal oxide and/or metal nitride, any technique can be used, and for example, a dry method such as a evaporation method, a sputtering method or a CVD (Chemical Vapor Deposition) method, a wet method such as a sol-gel method, or a technique of coating a solution formed by dispersing particles of metal oxide and/or metal nitride in a solvent can be utilized.

Meanwhile, when the insulating layer is provided on both surfaces of the metal foil, an insulating film including metal oxide and/or metal nitride may be provided on both surfaces of the metal foil, or a plastic insulating layer such as a polyimide sheet may be provided on both surfaces of the metal foil. In addition, an insulating layer including metal oxide and/or metal nitride may also be provided on one surface of the metal foil, and a plastic insulating layer such as a polyimide sheet may also be provided on the other surface.

[Anode]

The anode 12 is an electrode film that supplies (injects) the light-emitting layer with holes, and is formed of an electrode material having a large work function (4 eV or more) such as metal, alloy, a conductive compound or a mixture thereof.

Meanwhile, the anode 12 has an arbitrary refractive index, but preferably the value thereof is in the range of about 1.5 to 2.0, and particularly preferably the value is in the range of about 1.55 to 1.85. Furthermore, the sheet resistance (surface resistance) of the anode 12 has preferably a value of several hundred f/sq or less. Moreover, the thickness of the anode 12 varies depending on the forming material, but is set, generally, to be a value in the range of about 10 to 1000 nm, preferably about 10 to 200 nm.

It is possible to use, as the electrode material having such characteristics, for example, an electrode material having optical transparency, including metal such as Au, or a metal compound such as CuI, ITO (Indium Tin Oxide), $SnO_2$ or ZnO. Furthermore, the anode 12 can also be formed of an amorphous transparent electrode material such as IDIXO (registered trade mark: $In_2O_3$—ZnO).

The anode 12 is formed by evaporating or sputtering the electrode material described above. At this time, the anode 12 may be formed into an intended shape pattern by using a photolithographic technology. Meanwhile, in the anode 12, when the accuracy for the shape pattern is not required (the case where the accuracy is about 100 µm or more), the anode 12 of an intended pattern may be formed using a mask into which the intended shape pattern has been formed, when forming the anode 12, for example, by a technique such as evaporation or sputtering.

Furthermore, the anode 12 can be formed of an organic conductive compound. In this case, since the organic conductive compound is a material that can be coated, the anode 12 can be formed using, for example, a wet film forming technique such as a printing system or a coating system.

[Organic Compound Layer]

The organic compound layer 13 includes, as mentioned above, various organic layers such as the injection layer, the blocking layer and the transport layer of carriers (holes and electrons), in addition to the light-emitting layer. Here, the configuration of the respective organic layers will be explained more specifically.

(1) Light-Emitting Layer

The light-emitting layer is a layer in which a hole injected directly from the anode 12 or via the hole transport layer or the like from the anode 12, and an electron injected directly from the cathode 14 or via the electron transport layer or the like from the cathode 14 recombine and light is emitted. Meanwhile, the part in which the light is emitted may be inside the light-emitting layer, or may be at the interface between the light-emitting layer and a layer adjacent to it.

The light-emitting layer may be constituted of a single layer, or may be constituted by stacking a plurality of layers. When the light-emitting layer is constituted of a plurality of layers, the plurality of layers having the same emission spectrum or the same emission maximum wavelength may be stacked, or the plurality of layers having different emission spectra or different emission maximum wavelengths from each other may be stacked (for example, the light-emitting layer is constituted of light-emitting layers each having such color as blue, green or red). Meanwhile, in the latter case, the provision of a non-emission type intermediate layer between light-emitting layers adjacent to each other is preferable.

In the present embodiment, the light-emitting layer is formed of an organic light-emitting material containing a host compound (host material) and a light-emitting material (light-emitting dopant compound). In the light-emitting layer having the configuration, arbitrary emission color can be obtained by adjusting suitably the emission wavelength of the light-emitting material, kind of the light-emitting material to be contained, or the like. In addition, in the present embodiment, preferably the light is emitted by means of the light-emitting material.

The total thickness of the light-emitting layer can be set suitably, for example, depending on emission properties or the like to be required. For example, from the viewpoint of homogeneity of the constituent film, prevention of the application of an unnecessary high voltage at the time of light emission, the improvement of the stability of emission color relative to a driving current, or the like, the total thickness of the light-emitting layer is preferably set, for example, to be a value in the range of about 1 to 200 nm. In particular, from the viewpoint of a low driving voltage, the total thickness of the light-emitting layer is preferably set to be a value of about 30 nm or less.

Meanwhile, in the case where the light-emitting layer is constituted of a plurality of layers and an intermediate layer is provided between the layers adjacent to each other, the thickness of the whole light-emitting layer including the intermediate layer is preferably set to be a value in the numerical range described above. Furthermore, when the light-emitting layer is constituted of a plurality of layers, the thickness of each of layers is preferably set to be a value in the range of about 1 to 50 nm, and set more preferably to be a value in the range of about 1 to 20 nm. Meanwhile, when the light-emitting layer is constituted of a plurality of layers, the relationship of thickness between respective layers can be arbitrarily set.

The light-emitting layer having the above-mentioned configuration can be formed using a known technique to form a thin film such as, for example, a vacuum evaporation method, a spin coat method, a casting method, an LB (Langmuir-Blodgett) method or an inkjet method. Hereinafter, the configuration of the host compound and the light-emitting material contained in the light-emitting layer will be explained specifically.

(a) Host Compound

A compound in which phosphorescence quantum yield of phosphorescence emission at room temperature (25° C.) is less than about 0.1 is preferably used as the host compound contained in the light-emitting layer. In particular, a compound in which phosphorescence quantum yield is less than about 0.01 is preferably used as the host compound. In addition, the volume ratio of the host compound in the light-emitting layer is preferably set to be about 50% or more among various compounds contained in the light-emitting layer.

A known host compound can be used as the host compound. At this time, a host compound of one kind may be used, or a plurality of kinds of host compounds may be used together. The use of a plurality of kinds of host compounds makes it possible to adjust the mobility (amount of movement) of charges (holes and/or electrons), and to improve the emission efficiency of the organic EL element 10.

Examples of the compounds usable as the host compound having the above-mentioned characteristics include known low-molecular compounds, high-molecular compounds having a repeating unit, low-molecular compounds having a polymerizable group such as a vinyl group or an epoxy group (vapor deposition polymerizable light-emitting host) and the like. Meanwhile, a compound having a hole transport function, an electron transport function, a function of preventing increase in wavelength of the emission and high Tg (glass transition temperature) is preferably used as the host compound. Additionally, the "glass transition temperature (Tg)" referred to here is a value obtained by a technique in accordance with JIS-K7121 using a DSC (Differential Scanning Calorimetry) method.

Specifically, it is possible to use, as the host compound, compounds described in literatures such as Japanese Patent Laid-Open Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 or 2002-308837.

Meanwhile, in the present embodiment, the host compound is preferably a carbazole derivative, and, in particular, is a carbazole derivative and a dibenzofuran compound (for example, a host compound having a structural formula (1) H-A used in various Examples to be described later).

(b) Light-Emitting Material

It is possible to use, as the light-emitting material, for example, a phosphorescent light-emitting material (phosphorescent compound, phosphorescence light-emitting compound), fluorescent light-emitting material or the like. Meanwhile, in one light-emitting layer, one kind of light-emitting material may be contained, or a plurality of kinds of light-emitting materials having different emission maximum wavelengths from each other may be contained. The use of a plurality of kinds of light-emitting materials makes it possible, as mentioned above, to mix a plurality of kinds of light different in emission wavelengths, and consequently, to obtain light having arbitrary emission color. White light can be obtained by, for example, allowing a light-emitting layer to contain a blue light-emitting material, a green light-emitting material and a red light-emitting material (three kinds of light-emitting materials).

Furthermore, a phosphorescent light-emitting material and a fluorescent light-emitting material may be mixed in one light-emitting layer. Moreover, in the present embodiment, when allowing one light-emitting layer to contain two or more kinds of light-emitting materials, the concentration ratio of the light-emitting materials in the light-emitting layer may be varied in the thickness direction of the light-emitting layer.

The phosphorescent light-emitting material is a compound that gives emission from an excited triplet. Specifically, the phosphorescent light-emitting material is a compound that emits phosphorescent light at room temperature (25° C.), and a compound that gives a phosphorescence quantum yield value of about 0.01 or more at 25° C. Meanwhile, in the present embodiment, the use of a phosphorescent light-emitting material that gives a phosphorescence quantum yield value of about 0.1 or more is preferable. The phosphorescence quantum yield can be measured by the technique, for example, described in "Fourth Edition Course of Experimental Chemistry 7, Spectroscopy II" (Maruzen, 1992), Page 398. Furthermore, the phosphorescence quantum yield in a solution can be measured using various solvents, and in the present embodiment, the phosphorescent light-emitting material may be a phosphorescent light-emitting material that gives phosphorescence quantum yield of about 0.01 or more in an arbitrary solvent.

The process (principle) of emission (phosphorescent light emission) in the light-emitting layer containing the above-mentioned host compound and phosphorescent light-emitting material includes the following two kinds of processes.

A first emission process is an emission process of an energy transfer type. In the emission process of this type, first, carriers are recombined on the host compound in the light-emitting layer through which carriers (holes and electrons) are transported, and thus the excited state of the phosphorescent light-emitting material is generated. Then, the energy generated at this time is transferred from the host compound to the phosphorescent light-emitting material (the energy level of the excited state is transferred from the excitation level of the host compound to the excitation level of the phosphorescent light-emitting material (excited triplet)), and as a result, light emission is generated from the phosphorescent light-emitting material.

A second emission process is an emission process of a carrier-trap type. In the emission process of this type, the phosphorescent light-emitting material traps carriers (holes and electrons) in the light-emitting layer. As the result, the recombination of carriers occurs on the phosphorescent light-emitting material, and light emission is generated from the phosphorescent light-emitting material. In both emission processes mentioned above, the energy level in the excited state of the phosphorescent light-emitting material is required to be set to be lower than the energy level in the excited state of the host compound.

It is possible to suitably select and use, as the phosphorescent light-emitting material that causes the emission process mentioned above to be generated, an intended phosphorescent light-emitting material from among known various phosphorescent light-emitting materials used in conventional organic EL elements. It is possible to use, as the phosphorescent light-emitting material, for example, a complex-based compound containing a metal element in the group 8 to the group 10 of the periodic table of elements. Among such complex-based compounds, the use of any of iridium compounds, osmium compounds, platinum compounds (platinum complex-based compounds), and rare earth complexes is preferable as the phosphorescent light-emitting material. In the present embodiment, in particular, the use of an iridium compound (for example, the phosphorescent light-emitting material having structural formulae (2) to (4) used in various Examples to be mentioned later) as the phosphorescent light-emitting material is preferable.

Furthermore, it is possible to use, as the fluorescent light-emitting material (fluorescent light-emitting body, fluorescent dopant), for example, a coumarin-based dye, a pyran-based dye, a cyanine-based dye, a croconium-based dye, a squarylium-based dye, an oxobenzanthracene-based dye, a fluorescein-based dye, a rhodamine-based dye, a pyrylium-based dye, a perylene-based dye, a stilbene-based dye, a polythiophene-based dye, a rare earth complex-based fluorescent body and the like.

Moreover, it is possible to use, as the fluorescent light-emitting material, for example, conventionally known fluorescent light-emitting materials described in International Publication No. 00/70655, Japanese Patent Laid-Open Nos. 2002-280178, 2001-181616, 2002-280179, 2001-181617, 2002-280180, 2001-247859, 2002-299060, 2001-313178, 2002-302671, 2001-345183, 2002-324679, International Publication No. 02/15645, Japanese Patent Laid-Open Nos. 2002-332291, 2002-50484, 2002-332292, 2002-83684, Japanese Unexamined Patent Application Publication (Translation of PCT application) No. 2002-540572, Japanese Patent Laid-Open Nos. 2002-117978, 2002-338588, 2002-170684, 2002-352960, International Publication No. 01/93642, Japanese Patent Laid-Open Nos. 2002-50483, 2002-100476, 2002-173674, 2002-359082, 2002-175884, 2002-363552, 2002-184582, 2003-7469, Japanese Unexamined Patent Application Publication (Translation of PCT application) No. 2002-525808, Japanese Patent Laid-Open No. 2003-7471, Japanese Unexamined Patent Application Publication (Translation of PCT application) No. 2002-525833, Japanese Patent Laid-Open Nos. 2003-31366, 2002-226495, 2002-234894, 2002-235076, 2002-241751, 2001-319779, 2001-319780, 2002-62824, 2002-100474, 2002-203679, 2002-343572 or 2002-203678.

(c) Intermediate Layer

As mentioned above, when the light-emitting layer is constituted of a plurality of layers, the provision of a non-emission type intermediate layer (non-doped region) between adjacent layers is preferable. In this case, the thickness of the intermediate layer is preferably set to be a value in the range of about 1 to 20 nm. In particular, from the viewpoint of suppressing an interaction such as energy transfer between the intermediate layer and the adjoining light-emitting layer and of reducing the influence on current-voltage properties of the organic EL element 10, the thickness of the intermediate layer is preferably set to be a value in the range of about 3 to 10 nm.

The material for forming the intermediate layer can be formed of the same material as the host compound in the light-emitting layer. Meanwhile, when the intermediate layer is provided, the material for forming the intermediate layer may be the same as, or may be different from, the material for forming the host compound of the adjacent light-emitting layer, but preferably the material for forming the intermediate layer is the same as the material for forming the host compound of at least one light-emitting layer among the adjacent two light-emitting layers.

When a compound that is common between the intermediate layer (non-doped light-emitting layer) and each of the light-emitting layers is contained as described above, following advantages are obtained. For example, when a common host material (the fact that "the host material is common" referred to herein means, in addition to the case where the molecular structure of the host materials is identical, cases where a physicochemical property such as a phosphorescent light-emitting energy, the glass transition temperature or the like of the host materials is identical, etc.) is used between both layers, there is obtained an effect in which an injection barrier of carriers at the interface between the light-emitting layer and the intermediate layer is reduced and an injection balance between holes and electrons tends to be maintained easily even if a voltage (current) is varied. Furthermore, when a common host material is used between the intermediate layer and the light-emitting layer, complexity in the production of an element, which is large problems in conventional productions of an organic EL element, can also be eliminated.

Meanwhile, in the present embodiment, the host material plays a role of carrier transport, and thus a material having a carrier transport function is preferable. Carrier mobility is used as the physical property representing the carrier transport function, and the carrier mobility of an organic material depends, generally, on field intensity. Therefore, when a material that is highly dependent on the field intensity is used as the host material, since the injection balance between holes and electrons tends to be lost easily, as the host compound of the light-emitting layer and a material for forming the intermediate layer, a host material in which the carrier mobility is not highly dependent on the field intensity is preferably used. Furthermore, in order to adjust the injection balance between holes and electrons to be optimum, the non-emission type intermediate layer may be caused to function as a blocking layer of a carrier (hole blocking layer, electron blocking layer) to be mentioned later.

(2) Injection Layer (Hole Injection Layer, Electron Injection Layer)

In the organic compound layer 13, as necessary, an injection layer of a carrier (hole injection layer and/electron transport layer) is provided. The injection layer is a layer for achieving lowering of the drive voltage or improvement of emission luminance, and is provided between the electrode and the organic layer (light-emitting layer).

The hole injection layer (anode buffer layer) is provided between the anode and the light-emitting layer or hole transport layer, and the electron injection layer (cathode buffer layer) is provided between the cathode and the light-emitting layer or electron transport layer. Furthermore, each of injection layers (buffer layers) is desirably formed of a very thin film, and in the present embodiment, the thickness is preferably set to be a value in the range of about 0.1 nm to 5 µm, although each of injection layers depends on the formation material.

Meanwhile, the configurations of the respective injection layers are described in detail, for example, in "Organic EL Element and Industrial Forefront Thereof (published by NTS INC., Nov. 30, 1998)," second edition, chapter 2, "Electrode Material" (pages 123 to 166).

Furthermore, the configuration of the hole injection layer (anode buffer layer) is also described in detail in Japanese Patent Laid-Open Nos. 09-45479, 09-260062, 08-288069 etc. Specifically, there are exemplified a phthalocyanine buffer layer formed by using copper phthalocyanine or the like, an oxide buffer layer formed by using vanadium oxide or the like, an amorphous carbon buffer layer, a polymer buffer layer formed by using a conductive polymer such as polyaniline (emeraldine) or polythiophene, etc. as the hole injection layer. Meanwhile, as explained in various Examples to be mentioned later, for example, a compound containing PEDOT (poly(3,4-ethylenedioxythiophene)) may be used as a material for forming the hole injection layer.

Moreover, the configuration of the electron injection layer (cathode buffer layer) is also described in detail in Japanese Patent Laid-Open Nos. 06-325871, 09-17574 and 10-74586. Specifically, there are exemplified metal buffer layers formed by using strontium, aluminum or the like, alkali metal compound buffer layers formed by using lithium fluoride, potassium fluoride or the like, alkali earth metal compound buffer layers formed by using magnesium fluoride or the like, oxide buffer layers formed by using aluminum oxide or the like, as the electron injection layer.

(3) Blocking Layer (Hole Blocking Layer, Electron Blocking Layer)

In the organic compound layer 13, a blocking layer for a carrier (hole blocking layer and/or electron blocking layer) is provided as needed. Meanwhile, the configuration of the blocking layer is described in detail, for example, in Japanese Patent Laid-Open Nos. 11-204258 and 11-204359, and in "Organic EL Element and Industrial Forefront Thereof (published by NTS INC., Nov. 30, 1998)," page 237 etc.

The hole blocking layer is a layer having a function of an electron transport layer in a broad sense, and is formed from a material that has an electron transport function but has an extremely small hole transport ability. By providing the hole blocking layer, it is possible to adjust the balance between holes and electrons injected into the light-emitting layer to be the optimum injection balance, and as the result, to improve the recombination probability of an electron and a hole. Furthermore, it is possible to use a configuration of the electron transport layer to be mentioned later if needed, as the configuration of the hole blocking layer. Moreover, the hole blocking layer is preferably provided adjacent to the light-emitting layer.

On the other hand, the electron blocking layer is a layer having a function of the hole transport layer in a broad sense, and is formed of a material that has a hole transport function but has an extremely small electron transport ability. By providing the electron blocking layer, it is possible to adjust the balance between holes and electrons injected into the light-emitting layer to be the optimum injection balance, and as the result, to improve the recombination probability of an electron and a hole. In addition, a configuration of the hole transport layer to be mentioned later can be used as the configuration of the electron blocking layer, as necessary.

Furthermore, thicknesses of the respective blocking layers are preferably set to be a value in the range of about 3 to 100 nm, and more preferably set to be a value in the range of about 5 to 30 nm.

(4) Transport Layer (Hole Transport Layer and Electron Transport Layer)

In the organic compound layer 13, a transport layer of a carrier (hole transport layer and/or electron transport layer) is provided as necessary.

(a) Hole Transport Layer

The hole transport layer is a layer that transports (injects) holes supplied from the anode 12 to the light-emitting layer. Furthermore, the hole transport layer acts as a barrier that inhibits inflow of electrons from the cathode 14 side. Therefore, the phrase of the "hole transport layer" is sometimes used in a broad sense including the hole injection layer and/or electron blocking layer. Meanwhile, only one layer of the hole transport layer may be provided or a plurality of layers may be provided.

Any of organic materials and inorganic materials can be used as a hole-transport material, as long as it is a material capable of expressing the function of transporting (injecting) holes and the function of inhibiting the inflow of an electron as referred to above. Specifically, examples of the compounds usable as the hole transport material include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline-based copolymers and conductive high molecular oligomers (in particular, thiophene oligomer).

Furthermore, it is possible to use, as the hole-transport material, compounds such as the porphyrin compound, aromatic tertiary amine compounds (styrylamine compounds). In particular, in the present embodiment, the use of an aromatic tertiary amine compound as the hole-transport material is preferable.

Examples of the compounds usable as the aromatic tertiary amine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quarterphenyl, N,N,N-tri(p-tolyl)amine and the like. In addition, examples of styrylamine compounds usable as the aromatic tertiary amine compound include 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostilbenzene and the like. Furthermore, as the aromatic tertiary amine compound, there may be used a compound such as N-phenylcarbazole, a compound having two condensed aromatic rings in a molecule as described in U.S. Pat. No. 5,061,569 (for example, 4,4'-bis[N-(1-naphthyl)-N-phenylamino]biphenyl (NPD)), or 4,4',4"-tris[N-(3-methylphenyl)-N-phenylamino]triphenylamine (MTDATA) in which three triphenylamine units are linked in a starburst type as described in Japanese Patent Laid-Open No. 04-308688. Moreover, as explained in Example to be mentioned later, a compound such as poly-N,N'-bis(4-butylphenyl)-N,N'-bis(phenyl)benzidine may be used as the hole-transport material.

In addition, it is also possible to use, as the hole transport material, for example, a polymer material in which each of various hole transport materials above mentioned is introduced in the polymer chain, or a polymer material in which each of various hole transport materials mentioned above is used as the main chain of the polymer. Meanwhile, it is also possible to use an inorganic compound such as p-type Si or p-type SiC, as the hole transport material and a material for forming the above-mentioned hole injection layer.

Furthermore, for example, a material referred to as a so-called p-type hole transport material, as described in Japanese Patent Laid-Open No. 11-251067 or literature by J. Huang et. al. (Applied Physics Letters 80 (2002), p 139), may be used as the hole transport material. Meanwhile, when such a material is used as the hole transport material, an emission element having a higher efficiency can be obtained.

Moreover, in the present embodiment, a hole transport layer having high p properties (being rich in holes) may be formed by doping impurities into the hole transport layer. Examples thereof are described in, for example, literatures of Japanese Patent Laid-Open Nos. 04-297076, 2000-196140, 2001-102175, J. Appl. Phys., 95, 5773 (2004) or the like. When the hole transport layer that is rich in holes is used, the organic EL element 10 with a lower electric power consumption can be produced.

The hole transport layer having the above-described configuration can be formed using a known technique such as a vacuum evaporation method, a spin coat method, a casting method, printing methods including an inkjet method or an LB method. Meanwhile, the thickness of the hole transport layer can be set arbitrarily, and is generally set to be a value in the range of about 5 nm to 5 µm, preferably a value in the range of about 5 to 200 nm. Furthermore, when the hole transport layer is formed into an one-layer structure, one kind or two or more kinds of materials among the above-described various hole transport materials may be set to be contained in the hole transport layer.

(b) Electron Transport Layer

The electron transport layer is a layer that transports (injects) electrons supplied from the cathode 14 into the light-emitting layer. Furthermore, the electron transport layer also acts as a barrier that inhibits the inflow of a hole from the anode 12 side. Therefore, the phrase of "electron transport layer" is sometimes used, in a broad sense, as the meaning also including the electron injection layer and/or the hole blocking layer. Meanwhile, as to the electron transport layer, only one layer may be provided, or a plurality of layers may be provided.

An arbitrary material can be used as an electron transport material (serving as a hole-inhibiting material) used for the electron transport layer adjacent to the cathode 14 side of the light-emitting layer (which corresponds to the electron transport layer when the electron transport layer has a one-layer structure, or which corresponds to an electron transport layer positioned on the side the most close to the light-emitting layer when the electron transport layer is provided in a plural number), as long as it is a material having a function of transferring (transporting) electrons injected from the cathode 14, to the light-emitting layer. For example, as the electron transport material, it is possible to arbitrarily select and use a suitable compound from among various known compounds to be used in conventional organic EL elements.

More specifically, examples of the compounds usable as the electron transport material include nitro-substituted fluorene derivatives, diphenylquinone derivatives, thiopyrandioxide derivatives, carbodiimide derivatives, fluorenylidenemethane derivatives, anthraquinodimethane and anthrone derivatives, oxadiazole derivatives and the like. Furthermore, in the oxadiazole derivatives, it is also possible to use, as the electron transport material, thiadiazole derivatives obtained by substituting an oxygen atom of an oxadiazole ring with a sulfur atom, and quinoxaline derivatives having a quinoxaline ring known as an electron-withdrawing group. In addition, it is also possible to use, as the electron transport material, polymer materials having these materials introduced into a polymer chain, or polymer materials having these materials as the main chain of the polymer. Moreover, as explained in Example to be mentioned later, it is also possible to use, as the electron transport material, a compound such as a carbazole derivative (compound having a structural formula (5) ET-A to be mentioned later).

Furthermore, it is also possible to use, as the electron transport material, for example, metal complexes of 8-quinolinol derivatives such as tris(8-quinolinol)aluminum (Alq3), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq), and metal complexes in which the central metal of these metal complexes is substituted with In, Mg, Cu, Ca, Sn, Ga or Pb. In addition, it is also possible to use, as the electron transport material, metal-free phthalocyanine or metal phthalocyanine, or materials in which the end thereof has been substituted with an alkyl group or a sulfonic acid group. Moreover, it is possible to use, as the electron transport material, distyrylpyrazine derivatives exemplified as the material for the light-emitting layer. Furthermore, in the same way as in the hole injection layer and the hole transport layer, it is also possible to use, as the electron transport material, an inorganic compound (inorganic semiconductor) such as n-type Si or n-type SiC.

In addition, in the present embodiment, impurities may be doped into the electron transport layer as a guest material and an electron transport layer having high n properties (being rich in electrons) is formed. Specific examples of electron transport layers having the configuration is described, for example, in literatures such as Japanese Patent Laid-Open Nos. 04-297076, 10-270172, 2000-196140, 2001-102175 or J. Appl. Phys., 95, 5773 (2004).

The electron transport layer having the above-described configuration can be formed by a known technique such as a vacuum evaporation method, a spin coating method, a casting method, printing methods including an inkjet method or an LB method. Meanwhile, the thickness of the electron transport layer can be set arbitrarily, and generally, is set to be a value in the range of about 5 nm to 5 µm, preferably a value in the range of about 5 to 200 nm. Furthermore, when the electron transport layer of a one-layer structure is formed, one kind or two or more kinds of materials among the above-described various electron transport materials may be set so as to be contained in the electron transport layer.

[Cathode]

The cathode 14 is an electrode film that supplies (injects) electrons into the light-emitting layer, and usually, is formed of an electrode material having a small work function (4 eV or less) such as metal (electron injection metal), alloy, a conductive compound or a mixture thereof.

The cathode 14 can be formed of an electrode material such as aluminum, sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture or rare-earth metal. Among these electrode materials, from the viewpoint of electron injection ability, durability against oxidation and the like, a mixture of an electron injection metal and a second metal that has a work function larger than that thereof and is stable, for example, a magnesium/silver mixture, a magnesium/aluminum mixture, a magnesium/indium mixture, an aluminum/aluminum oxide ($Al_2O_3$) mixture, a lithium/aluminum mixture, aluminum and the like are suitable.

Furthermore, the sheet resistance of the cathode 14 has preferably a value of several hundred Ω/sq or less. Furthermore, the thickness of the cathode 14 is, generally, set to be a value in the range of about 10 nm to 5 μm, preferably set to be a value in the range of about 50 nm to 200 nm.

The cathode 14 having the configuration mentioned above can be formed by a technique such as, for example, evaporation or sputtering.

Meanwhile, in the organic EL element 10, when light is to be extracted from the cathode 14 side, the cathode 14 can be formed, for example, in the same way as the anode 12 described above, of an electrode material having optical transparency. In this case, a transparent or translucent cathode 14 can be formed by forming a metal film made of the electrode material for the cathode with a thickness in the range of about 1 nm to 20 nm, and after that, by forming, on the metal film, the conductive transparent material explained for the anode 12.

[Light Extraction Sheet]

The light extraction sheet 2 may include, for example, as shown in FIG. 1, a light diffusion sheet having a base material 2a and a light diffusion layer 2b formed on the surface of the base material 2a opposite to the organic EL element main body 1 side. The light extraction sheet 2 is attached on the surface of the element substrate 11 opposite to the anode 12 side via, for example, an adhesive or the like. At this time, the light extraction sheet 2 is attached to the element substrate 11 so that the surface of the light extraction sheet 2 opposite to the light diffusion layer 2b side of the base material 2a faces the element substrate 11.

In the present embodiment, the light extraction sheet 2 includes a light diffusion sheet in which a haze value is about 90 or more and the total light transmittance (total ray transmittance) value is about 80% or more. More preferably, the light extraction sheet 2 includes a light diffusion sheet in which the haze value is 92 or more and the total light transmittance value is 82% or more. Particularly preferably, the light extraction sheet 2 includes a light diffusion sheet in which the haze value is 94 or more and the total light transmittance value is about 85% or more.

The haze value of the light extraction sheet 2 can be controlled by the content of an addition material (addition compound) having both light diffusion and scattering functions, contained in the light diffusion layer 2b. In addition, the total light transmittance of the light extraction sheet 2 can be controlled by increasing or decreasing the transparency of the base material 2a.

The haze value is represented by a formula below.

Haze value (fogging)={diffuse transmittance (%)/total light transmittance (%)}×100(%)

Meanwhile, the haze value can be measured by a technique described in JIS-K-7136 "Plastics-Determination of haze for transparent materials," or in ISO 14782 "Plastics-Determination of haze for transparent materials."

On the other hand, the total light transmittance can be measured by a technique described in JIS-K-7361-1 "Plastics-Determination of the total luminous transmittance of transparent materials," or in ISO 13468-1 "Plastics-Determination of the total luminous transmittance of transparent materials."

(a) Base Material

The base material 2a of the light extraction sheet 2 in the present embodiment can be constituted of any base material as long as it is a base material having optical transparency. Furthermore, in the present embodiment, a refractive index n1 of the base material 2a preferably has a value of about 1.65 or more.

Examples of the base materials 2a that satisfy the conditions include a glass film, a transparent resin film or the like. From the viewpoint of flexibility, the use of a transparent resin film as the base material 2a is preferable. In this case, the thickness of the transparent resin film is preferably set to be a value in the range of about 50 μm to 250 μm.

Meanwhile, the material for forming the transparent resin film can be formed of the same material as the element substrate 11. In addition, in the present embodiment, as the material for forming the transparent resin film, the use of any of a polycarbonate film, a polyethylene terephthalate (PET) film, a polyethylene naphthalate (PEN) film or a fluororesin-containing film is preferable.

Any material can be used as the material for forming the fluororesin-containing film. For example, the fluororesin-containing film can include a film containing a compound such as polytetrafluoroethylene (PTFE), polychlorotrifluoroethylene (PCTFE), polyvinylidene fluoride (PVDF), copolymer of tetrafluoroethylene and perfluoroalkoxyethylene (PFA), copolymer of ethylene and tetrafluoroethylene (ETFE), copolymer of tetrafluoroethylene and hexafluoropropylene (FEP) or the like.

In addition, from the viewpoint of improving flexibility and luminance, the use of a thin film glass as the base material 2a is preferable. Meanwhile, the "thin film glass" mentioned here is a glass film having a thickness of 0.5 mm or less.

(b) Additive Material

Examples of the additive materials having diffusing and scattering functions of light to be added (contained) in the light extraction sheet 2 include a silicon compound (Si-containing organic compound), a polyacrylic acid ester resin, and a bromine-containing compound or the like. In addition, in the present embodiment, the light extraction sheet 2 has a configuration containing at least a silicon compound (Si-containing organic compound) as an additive material.

Representative examples of the silicon compounds usable in the light extraction sheet 2 in the present embodiment include a silicon resin and a silicon oil. There can be used as the silicon resin, for example, resin having a three-dimensional network structure in which units of $RSiO_{3/2}$, $RSiO$ and $RSiO_{1/2}$ can be combined, or the like. Meanwhile, "R" in the chemical formula represents a substituent such as a C1 to C10 alkyl group such as a methyl group, an ethyl group or a propyl group or an aromatic group, or a substituent containing a vinyl group in the aforementioned substituents.

There can be used as the silicon oil, polydimethylsiloxane, modified polysiloxane in which at least one methyl group on a side chain or at the end of polydimethylsiloxane has been modified by a group selected from the group consisting of hydrogen, an alkyl group, a cyclohexyl group, a phenyl group, a benzyl group, an epoxy group, polyether group, a carboxyl group, a mercapto group, a chloroalkyl group, an alkylalcohol ester group, an alcohol group, an allyl group, a vinyl group, a trifluoromethyl group and combinations thereof, or a mixture thereof.

Examples of polyacrylic acid ester resin that can be contained in the light extraction sheet 2 in the present embodiment include copolymer of a methylmethacrylate monomer and at least one monomer selected from the group consisting of linear, branched or cyclic alkyl(meth)acrylate excluding a methylmethacrylate monomer and combinations thereof. More specifically, as explained in Examples to be mentioned later, for example, polymethylmethacrylate resin (PMMA) can be used as the additive material.

In the copolymer mentioned above, it is possible to set the composition of the methylmethacrylate monomer to be a composition in the range of about 60 to 95% by mass, and to set the composition of another monomer to be a value in the range of about 5 to 40% by mass. In particular, it is more preferable that the composition of the methylmethacrylate monomer is a composition in the range of about 75 to 85% by mass and the composition of another monomer is a composition in the range of about 15 to 25% by mass. Furthermore, when an acrylic copolymer is used as the copolymer, the acrylic copolymer preferably has weight-average molecular weight of a value in the range of about 500,000 to 10,000,000 g/mol. Meanwhile, the acrylic copolymer can be manufactured by practicing a technique such as emulsion polymerization, suspension polymerization or solution polymerization.

Any compound can be used as the bromine-containing compound that can be incorporated in the light extraction sheet 2 of the present embodiment, as long as it is a compound containing bromine in the chemical structure.

Examples of the monomer-based organic bromine compounds usable as the bromine-containing compound include hexabromobenzene, pentabromotoluene, hexabromobiphenyl, decabromobiphenyl, hexabromocyclodecane, decabromodiphenyl ether, octabromodiphenyl ether, hexabromodiphenyl ether, bis(pentabromophenoxy)ethane, ethylene-bis (tetrabromophthalimide), tetrabromobisphenol A and the like. In addition, examples of halogenated polymer-based bromine compounds usable as the bromine-containing compound include brominated epoxy compounds (for example, a diepoxy compound manufactured by the reaction between brominated bisphenol A and epichlorohydrin, monoepoxy compounds obtained by the reaction between brominated phenols and epichlorohydrin), poly(brominated benzylacrylate), brominated polyphenylene ether, brominated bisphenol A, condensates of cyanuric chloride and brominated phenol, brominated polystyrenes such as brominated (polystyrene), poly(brominated styrene) and cross-linked brominated polystyrene, crosslinked or non-crosslinked brominated poly(α-methylstyrene) and the like. Meanwhile, the addition amount of the bromine-containing compound can be set to be a value in the range of about 1 to 50 parts by weight relative to 100 parts by weight of the polyamide resin.

(c) Surface Shape of Light Extraction Sheet

The surface shape on the light-emission side (light-extraction side) of the light extraction sheet 2 in the present embodiment may be a flat shape or a concave-convex shape.

When the surface shape of the light extraction sheet 2 is made into a concave-convex shape, for example, a concave-convex pattern may be formed on the surface of the light extraction sheet 2 by providing a film having a prescribed concave-convex pattern on the light diffusion layer 2b (hereinafter, referred to as a concave-convex film).

Furthermore, the width (size) of a concave part (convex part) of the concave-convex pattern in the sheet surface can be set to be a value in the range of about 0.5 μm to 20 μm. The depth (or the height) of the concave part (or the convex part) in the sheet thickness direction is arbitrarily set depending on the width (size) of the concave part (or the convex part) in the sheet in-plane direction or the cycle of the concave part (or the convex part). For example, the depth (or the height) of the concave part (or the convex part) in the sheet thickness direction can be set to be a value of the width of the concave part (or the convex part) or less in the sheet in-plane direction, or set to be a value of the cycle of the concave part (or the convex part) or less.

Furthermore, the shape of the concave part (or the convex part) is arbitrary, and for example, the surface shape of the concave part (or the convex part) is preferably formed into a shape having a curved surface. Meanwhile, when the surface shape of the concave part (or the convex part) is formed into a curved shape, in particular, the surface shape of the concave part (or the convex part) is preferably formed into a semispherical shape. In addition, the concave part (or the convex part) is preferably arranged regularly (cyclically) in the sheet surface, and for example, is preferably arranged in a grid shape.

It is possible to use, as a material for forming the concave-convex film, for example, a polymer material and glass. Meanwhile, it is possible to use materials such as, for example, polyarylate, polycarbonate, polycycloolefin, polyethylene naphthalate, polyethylene sulfonic acid, polyethylene terephthalate, as the polymer materials. The thickness of the concave-convex film can be set arbitrarily and, for example, it can be set to be a value in the range of about 20 μm to 1000 μm.

Any technique can be used as a technique for forming the concave-convex film, as long as it is a technique capable of forming a prescribed concave-convex pattern on the surface of the film. When a polymer material is employed as the material for forming the concave-convex film, there can be used methods such as compressing a metal plate having a concave-convex surface to a heated film to thereby transfer the concave-convex shape of the metal plate to the film, rolling a polymer film (sheet) by using a roll having a concave-convex surface, or extruding a polymer film (sheet) from a slit having a concave-convex shape to thereby be formed. Furthermore, when a polymer material is employed as the material for forming the concave-convex film, there can be used methods such as, for example, dropping a solution or a dispersion liquid containing the polymer material (hereinafter, referred to as cast) on a base table with a surface having a concave-convex shape to thereby form a film, or photo-polymerizing selectively a part of a film including a monomer and after that, removing parts not having been polymerized. Moreover, when a polymer material is employed as the material for forming the concave-convex film, there can be used a technique such as casting a polymer solution to a base table under high humidity conditions, and after that, heating and pressing the polymer solution with the use of a mold provided with concavity and convexity to thereby imprint the concave-convex shape of the mold (a technique of transferring a droplet structure to the surface).

As mentioned above, in the organic EL element 10 in the present embodiment, the light extraction sheet 2 having the light diffusion layer 2b to which at least a silicon compound is added, and having a haze value of about 90 or more and the total light transmittance value of about 80% or more, is used. By providing the light extraction sheet 2 of the configuration on the light extraction surface of the organic EL element 10, both light extraction efficiency and weather resistance can be improved (the detail of the effect will be explained in characteristic evaluation in various Examples below).

[Sealant]

The sealant 3 is a member for sealing the organic compound layer 13, and as shown in FIG. 1, is provided so as to cover the organic EL element main body 1. Meanwhile, although not shown in FIG. 1, when sealing the organic EL element main body 1 with the sealant 3, the organic EL element main body 1 is sealed so that extraction electrode parts of the anode 12 and the cathode 14 are exposed outside.

The sealant 3 can include an approximately plate-like (film-like) sealing member. Meanwhile, when a technique of a solid adhesion type is used as the sealing technique, a plate-like base material in which the surface on the element substrate 11 side is flat (flat plate-like sealing member), is used as the sealant 3, and the sealing member is caused to adhere to the element substrate 11 via an adhesive agent.

Furthermore, when a technique of a can sealing type is used as a sealing technique, an approximately plate-like base material in which a concave part is formed on the surface of the element substrate 11 side, that is, a concave plate-like sealing member (can) is used and the sealing member is caused to adhere to the element substrate 11 via an adhesive agent.

Moreover, when a technique of a film sealing is used as a sealing technique, a sealing film made of a film including an inorganic material or an organic material is used as the sealant 3. In addition, the sealing film is provided on the organic EL element main body 1 so that the organic EL element main body 1 is covered with the sealing film.

[Technique for Producing Organic EL Element]

Next, an example of a technique for producing the organic EL element 10 will be explained. Specifically, an example of a production technique when the organic EL element main body 1 has a configuration of anode/hole injection layer/hole transport layer/light-emitting layer/hole blocking layer/electron transport layer/cathode will be explained.

First, the element substrate 11 including the above-mentioned transparent material is prepared. Next, the anode 12 made of the above-mentioned transparent electrode material is formed on the surface opposite to the light extraction surface (the surface for which the light extraction sheet 2 is formed) of the element substrate 11.

Next, on the anode 12, the hole injection layer, the hole transport layer, the light-emitting layer, the hole blocking layer and the electron transport layer are stacked in this order and the organic compound layer 13 is formed. At this time, each of layers configuring the organic compound layer 13 is formed using various formation techniques explained in the configuration of the respective layers. Meanwhile, in the present embodiment, as the technique for forming the respective layers configuring the organic compound layer 13, in particular, the use of a vacuum evaporation method, a spin coat method, an inkjet method or a printing method is preferable. When forming the respective layers in the organic compound layer 13 using these techniques, there can be obtained advantages of, for example, easily obtaining homogeneous film quality, of being difficult in forming a pinhole in the film, or the like. In addition, when an evaporation method is adopted as a technique for forming the organic compound layer 13, evaporation conditions thereof are set suitably depending on conditions such as the type of an organic compound to be used. Specifically, the evaporation conditions are set preferably by suitable selection from respective ranges of about 50° C. to 450° C. of boat heating temperature, of about $10^{-6}$ Pa to $10^{-2}$ Pa of a vacuum degree, of about 0.01 nm/sec to 50 nm/sec of an evaporation rate, of about −50° C. to 300° C. of substrate temperature, and of about 0.1 nm to 5 μm (preferably 5 nm to 200 nm) of thickness of the film.

Next, after forming the organic compound layer 13, a thin film made of the above-mentioned electrode material for a cathode is deposited on the organic compound layer 13, in a thickness of about 1 μm or less, preferably in the range of about 50 to 200 nm, for example, by a technique such as evaporation or sputtering and the cathode 14 is formed. In the present embodiment, in this way, the organic EL element main body 1 is produced.

After that, on the surface of the organic EL element main body 1 on the cathode 14 side, the sealant 3 is provided to seal the organic compound layer 13. Then, finally, the light extraction sheet 2 is stuck on the light extraction surface (surface on the anode 12 side) of the element substrate 11 of the organic EL element main body 1. In the present embodiment, in this way, the organic EL element 10 is produced.

Meanwhile, in the above-mentioned production technique, preferably the anode 12, the organic compound layer 13 and the cathode 14 are consistently formed in the identical deposition apparatus under one-time evacuation, but the present invention is not limited to this. The organic compound layer 13 and various electrode films may be formed by taking out the substrate member from the deposition apparatus for every deposition process and performing a different deposition method for the substrate member. Meanwhile, in this case, considerations such as carrying out operations under a dry inert gas atmosphere are required. Furthermore, in the present embodiment, when the organic EL element main body 1 is to be formed, the stacking order of the respective layers may be reversed. That is, the cathode, the electron transport layer, the hole blocking layer, the light-emitting layer, the hole transport layer, the hole injection layer and the anode may be stacked on the element substrate 11 in this order.

<2. Configuration of Planar Light-Emitting Body>

Next, the planar light-emitting body produced by arranging (tiling) a plurality of the above-mentioned organic EL elements 10 will be explained.

[Configuration of Planar Light-Emitting Body]

Figure 2:
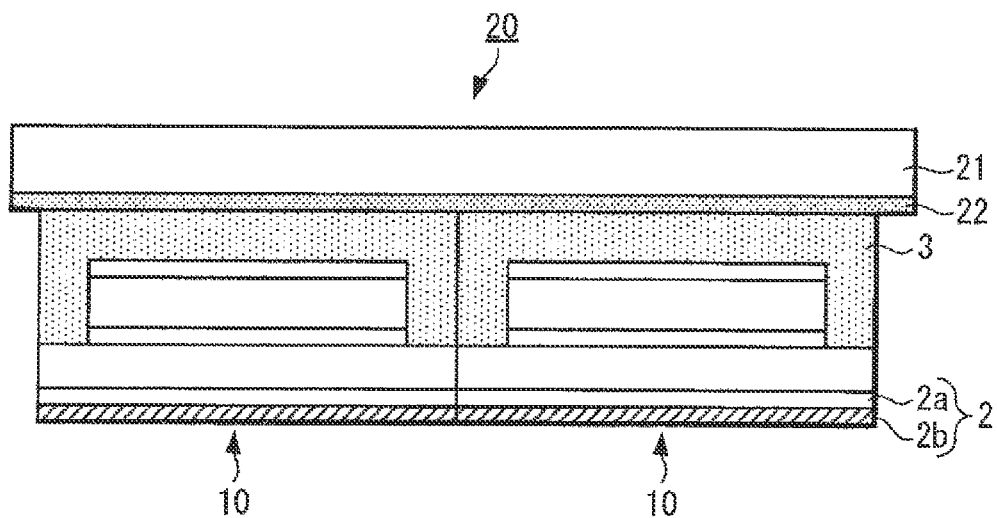
FIG. 2 is a schematic configuration sectional view of the planar light-emitting body according to an embodiment of the present invention.

In FIG. 2, a schematic configuration sectional view of the planar light-emitting body according to one embodiment of the present invention is shown. Meanwhile, in FIG. 2, a configuration example in which two organic EL elements 10 are arranged is shown in order to simplify the explanation, but the present invention is not limited to this. The number and arrangement form of the organic EL element 10 constituting the planar light-emitting body are set suitably, for example, depending on the intended use or the like.

The planar light-emitting body 20 includes two organic EL elements 10, a support substrate 21 (support member), and an adhesion member 22 for fixing each of the organic EL elements 10 on the support substrate 21.

In the planar light-emitting body 20, the surface of each of the organic EL elements 10 on the sealant 3 side is to be fixed on the larger-sized support substrate 21 with the adhesion member 22. Meanwhile, at this time, in the example shown in FIG. 2, two organic EL elements 10 are arranged on the support substrate 21 so that side surfaces of two organic EL elements 10 facing each other make contact with each other. Furthermore, at this time, two organic EL elements 10 are arranged on the support substrate 21 so that the light extraction surfaces (the surface of the light extraction sheet 2 on the light diffusion layer 2b side) of the arranged two organic EL elements 10 become flush with each other. Hereinafter, configurations of respective parts of the planar light-emitting body 20 will be explained more specifically.

[Support Substrate]

It is possible to use any plate-like member as the support substrate 21, as long as the member is a plate-like member that can maintain the state when two organic EL elements 10 are mounted via the adhesion member 22.

Meanwhile, when the planar light-emitting body 20 has a configuration of being bent flexibly, the support substrate 21 is constituted of a flexible substrate having bending properties. For example, it is possible to use a resin film or a glass substrate in which the value of the substrate thickness is in the range of about 0.01 mm to 0.50 mm, or the like, as the flexible substrate.

[Adhesion Member]

In the present embodiment, among adhesion members used being referred to as a gluing agent or an adhesive agent, or a gluing material or an adhesive material in various industrial fields, there is used a curable-type adhesion member 22 which forms a high-molecular-weight body or a cross-linked structure through various chemical reactions after being coated on the support substrate 21 or the sealant 3 to thereby stick the support substrate 21 and the sealant 3 together. That is, the adhesion member 22 is formed of a material, the material of adhesion parts being cured by irradiation with light such as ultraviolet rays, or by heating or pressurizing the adhesion member 22.

Examples of the adhesion members 22 having the above-mentioned physical properties include curable type adhesives such as urethane-based, epoxy-based, fluorine-containing-based, aqueous polymer-isocyanate-based and acrylic, moisture curable urethane adhesives, anaerobic adhesives such as a polyether methacrylate type, an ester-based methacrylate type and oxidized type polyether methacrylate, cyanoacrylate-based instant adhesives and acrylate-peroxide-based two-component type instantaneous adhesives, and the like.

In addition, any technique can be used as the technique for forming the adhesion member 22, and in particular, the use of a technique capable of supplying an uncured adhesive is preferable. Examples of the techniques include a gravure coater, a microgravure coater, a comma coater, a bar coater, spray coating, an inkjet method and the like. A technique suitable for an adhesive to be used is employed as a technique for curing the uncured adhesion member 22.

Meanwhile, in the example shown in FIG. 2, the configuration example in which a plurality of organic EL elements 10 is supported using the support substrate 21, has been explained, but the present invention is not limited to this. For example, when side parts of two organic EL elements 10 adjacent to each other are stuck each other with an adhesive (support member), the support substrate 21 may not be used.

<3. Various Examples and Evaluation Results>

Next, configurations of various Examples (samples) of actually produced organic EL elements of the present invention, and evaluation tests and results thereof carried out for organic EL elements produced in respective Examples will be explained.

[Various Light Extraction Sheets]

In organic EL elements in various Examples to be explained below, a plurality of kinds of light extraction sheets, which was different in configurations from each other, was used. Therefore, before explaining configurations of organic EL elements in various Examples, configurations and production techniques of light extraction sheets used in various Examples will be explained.

(1) First Light Extraction Sheet (Sample Number 1 of Light Extraction Sheet)

A first light extraction sheet was produced by coating a solution A for a light extraction sheet prepared in a composition described below (material for forming the light diffusion layer 2b), on a polyethylene terephthalate film (PET: the base material 2a) having a thickness of 100 µm.

(Solution A for Light Extraction Sheet)

Acrylic polyol (ACRYDIC 49-394IM <solid content 50%>, DIC CORPORATION): 162 parts by weight Isocyanate (TAKENATE D110N <solid content 60%>, MITSUI TAKEDA CHEMICALS, INC.): 32 parts by weight Silica resin particles (average particle diameter 27.2 µm): 200 parts by weight Butyl acetate: 215 parts by weight (2) Second Light Extraction Sheet (Sample Number 2 of Light Extraction Sheet)

A second light extraction sheet was produced by coating a solution B for a light extraction sheet prepared in a composition described below, on a polyethylene terephthalate film (PET) having a thickness of 100 µm.

(Solution B for Light Extraction Sheet)

Acrylic polyol (ACRYDIC 49-394IM <solid content 50%>, DIC CORPORATION): 162 parts by weight Isocyanate (TAKENATE D110N <solid content 60%>, MITSUI TAKEDA CHEMICALS, INC.): 32 parts by weight Silica resin particles (average particle diameter 27.2 em): 250 parts by weight Butyl acetate: 215 parts by weight (3) Third Light Extraction Sheet (Sample Number 3 of Light Extraction Sheet)

A third light extraction sheet was produced by coating a solution C for a light extraction sheet prepared in a composition described below, on a polyethylene terephthalate film (PET) having a thickness of 100 µm.

(Solution C for Light Extraction Sheet)

Acrylic polyol (ACRYDIC 49-394IM <solid content 50%>, DIC CORPORATION): 162 parts by weight Isocyanate (TAKENATE D110N <solid content 60%>, MITSUI TAKEDA CHEMICALS, INC.): 32 parts by weight Silica resin particles (average particle diameter 27.2 µm): 150 parts by weight Butyl acetate: 215 parts by weight (4) Fourth Light Extraction Sheet (Sample Number 4 of Light Extraction Sheet)

A fourth light extraction sheet was produced by coating a solution D for a light extraction sheet prepared in a composition described below, on a polyethylene terephthalate film (PET) having a thickness of 100 µm.

(Solution D for Light Extraction Sheet)

Acrylic polyol (ACRYDIC 49-394IM <solid content 50%>, DIC CORPORATION): 162 parts by weight Isocyanate (TAKENATE D110N <solid content 60%>, MITSUI TAKEDA CHEMICALS, INC.): 32 parts by weight Silica resin particles (average particle diameter 27.2 µm): 130 parts by weight Silicon resin particles (average particle diameter 30.0 µm): 80 parts by weight Butyl acetate: 215 parts by weight (5) Fifth Light Extraction Sheet (Sample Number 5 of Light Extraction Sheet)

A fifth light extraction sheet was produced by coating a solution D for a light extraction sheet used in the fourth light extraction sheet, on a polycarbonate film having a thickness of 100 µm.

(6) Sixth Light Extraction Sheet (Sample Number 6 of Light Extraction Sheet)

A sixth light extraction sheet was produced by coating a solution E for a light extraction sheet prepared in a composition described below, on a polycarbonate film having a thickness of 100 µm.

(Solution E for Light Extraction Sheet)

Acrylic polyol (ACRYDIC 49-394IM <solid content 50%>, DIC CORPORATION): 162 parts by weight Isocyanate (TAKENATE D110N <solid content 60%>, MITSUI TAKEDA CHEMICALS, INC.): 32 parts by weight Silica resin particles (average particle diameter 27.2 Mm): 120 parts by weight Silicon resin particles (average particle diameter 30.0 m): 80 parts by weight Polymethylmethacrylate resin (PMMA) particle (average particle diameter 8.0 µm): 30 parts by weight Butyl acetate: 215 parts by weight (7) Seventh Light Extraction Sheet (Sample Number 7 of Light Extraction Sheet)

A seventh light extraction sheet was produced by coating a solution F for a light extraction sheet prepared in a composition described below, on a polycarbonate film having a thickness of 100 µm.

(Solution F for Light Extraction Sheet)

Acrylic polyol (ACRYDIC 49-394IM <solid content 50%>, DIC CORPORATION): 162 parts by weight Isocyanate (TAKENATE D110N <solid content 60%>, MITSUI TAKEDA CHEMICALS, INC.): 32 parts by weight Silica resin particles (average particle diameter 27.2 µm): 110 parts by weight Silicon resin particles (average particle diameter 30.0 µm): 80 parts by weight Polymethylmethacrylate resin particle (average particle diameter 8.0 µm): 30 parts by weight Hexabromobenzene: 5 parts by weight Butyl acetate: 215 parts by weight (8) Eighth Light Extraction Sheet (Sample Number 8 of Light Extraction Sheet)

An eighth light extraction sheet was produced by sticking a polyethylene terephthalate (PET) film having a surface with cyclically arranged concave parts (concave-convex film) and having a thickness of 40 Mm, on the light diffusion layer of the seventh light extraction sheet. Meanwhile, the face shape of the concave part of the concave-convex film was set to be a spherical shape, the diameter of the concave part was set to be 5 µm, and the distance between the concave parts was set to be 3 µm (that is, the cycle of the concave-convex patterns was set to be 8 µm). The concave-convex pattern was formed by using the above-mentioned technique of transferring a droplet structure to the surface.

(9) Ninth Light Extraction Sheet (Sample Number 9 of Light Extraction Sheet)

A ninth light extraction sheet was produced by coating a solution G for a light extraction sheet prepared in a composition described below, on a polyethylene terephthalate (PET) film having a thickness of 100 µm.

(Solution G for Light Extraction Sheet)

Figures 3, 4:
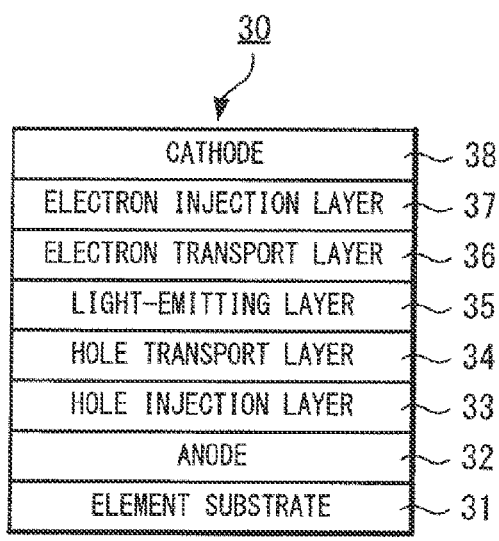
FIG. 3 is a diagram showing optical characteristics of light extraction sheets produced in various Examples.
FIG. 4 is a schematic configuration sectional view of an organic EL element main body of an organic EL element produced in various Examples.

Acrylic polyol (ACRYDIC 49-394IM <solid content 50%>, DIC CORPORATION): 162 parts by weight Isocyanate (TAKENATE D110N <solid content 60%>, MITSUI TAKEDA CHEMICALS, INC.): 32 parts by weight Silica resin particles (average particle diameter 27.2 µm): 180 parts by weight Silicon resin particles (average particle diameter 30.0 µm): 40 parts by weight Butyl acetate: 215 parts by weight The haze value and the total light transmittance were measured for various light extraction sheets produced as mentioned above. The measurement results are shown in FIG. 3. As mentioned above, in the present embodiment, the light extraction sheet 2 includes a light diffusion sheet in which the haze value is about 90 or more and the total light transmittance is about 80% or more. Therefore, the light extraction sheets of sample numbers 4 to 9 are the light extraction sheets usable in the present embodiment.

[Configurations of Organic EL Elements in Various Examples]

Next, the configurations of organic EL elements produced in various Examples below and production techniques thereof will be explained. In FIG. 4, a schematic configuration sectional view of the organic EL element main body in the organic EL element in various Examples is shown.

An organic EL element main body 30 includes an element substrate 31, an anode 32, a hole injection layer 33, a hole transport layer 34, a light-emitting layer 35, an electron transport layer 36, an electron injection layer 37 and a cathode 38. In addition, the anode 32, the hole injection layer 33, the hole transport layer 34, the light-emitting layer 35, the electron transport layer 36, the electron injection layer 37 and the cathode 38 are formed in this order on the surface of the element substrate 31 opposite to the light extraction surface.

Here, while explaining the production technique of the organic EL element main body 30, configurations of the respective layers (formation material, film thickness or the like) will be explained.

First, a glass substrate having a size of 60 mm×60 mm and a thickness of 0.7 mm was prepared as the element substrate 31. Next, an ITO film having a thickness of 100 nm (refractive index 1.85) was formed on the element substrate 31, and after that, the ITO film was subjected to a patterning treatment and the anode 32 of a prescribed pattern was formed. Subsequently, the element substrate 31 with the anode 32 formed was subjected to ultrasonic cleaning with isopropyl alcohol. Then, the cleaned element substrate 31 was dried by dry nitrogen gas, and furthermore the element substrate 31 after the drying was subjected to UV ozone cleaning for 5 minutes.

Next, a solution obtained by diluting poly(3,4-ethylene-dioxythiophene)-polystyrenesulfonate (PEDOT/PSS, Baytron P Al 4083, manufactured by Bayer) with pure water to 70% (a coating liquid for a hole injection layer) was coated on the anode 32 by a spin coater under conditions of 3000 rpm for 30 seconds. Subsequently, the element substrate 31, on which the coating liquid for a hole injection layer was coated, was dried for 1 hour under an environment giving the substrate surface temperature of 200° C. and thus the hole injection layer 33 having a thickness of 30 nm was formed.

Then, under a nitrogen atmosphere and under an atmosphere giving cleanliness of class 100 measured in accordance with JIS B 9920, the element substrate 31, on which the hole injection layer 33 had been formed, was moved into a glove box in which the value of dew-point temperature was −80° C. or less and the oxygen concentration was 0.8 ppm. Subsequently, in the glove box, a coating liquid for a hole transport layer having a composition described below was prepared, and the coating liquid for a hole transport layer was coated on the hole injection layer 33 by a spin coater under conditions of 1500 rpm for 30 seconds. In addition, the element substrate 31 on which the coating liquid for a hole transport layer had been coated was dried for 30 minutes under an environment giving substrate surface temperature of 150° C. and thus a hole transport layer 34 was formed. Meanwhile, when a hole transport layer was formed by coating the coating liquid for a hole transport layer on a substrate prepared separately under the same conditions as the above-described coating conditions of the coating liquid for a hole transport layer and the thickness thereof was measured, the thickness was 20 nm.

(Coating Liquid for a Hole Transport Layer)

Monochlorobenzene: 100 g

Poly-N,N'-bis(4-butylphenyl)-N,N'-bis(phenyl)benzidine (ADS254BE: manufactured by American Dye Source, Inc.): 0.5 g Subsequently, a coating liquid for a light-emitting layer having a composition described below was prepared, and the coating liquid for a light-emitting layer was coated on the hole transport layer 34 by a spin coater under conditions of 2000 rpm for 30 seconds. Then, the element substrate 31 on which the coating liquid for a light-emitting layer had been coated, was heated and dried for 30 minutes under an environment giving substrate surface temperature of 120° C. and thus light-emitting layer 35 was formed. Meanwhile, when a light-emitting layer was formed by coating the coating liquid for a light-emitting layer on a substrate prepared separately under the same conditions as the above-described coating conditions of the coating liquid for a light-emitting layer and the thickness thereof was measured, the thickness was 40 nm. In addition, in the light-emitting layer composition described below, the host compound (H-A) exhibited the lowest Tg (glass transition temperature), which was 132° C.

(Coating Liquid for a Light-Emitting Layer)

Butyl acetate: 100 g

Host compound (H-A): 1 g

First light-emitting material (D-A): 0.11 g

Second light-emitting material (D-B): 0.002 g

Third light-emitting material (D-C): 0.002 g

Meanwhile, the host compound (H-A), the first light-emitting material (D-A), the second light-emitting material (D-B), and the third light-emitting material (D-C) contained in the above-described coating liquid for a light-emitting layer are shown by the structural formulae (1) to (4) below, respectively. Meanwhile, an iridium compound was used as each of light-emitting materials.

[Chem 1]

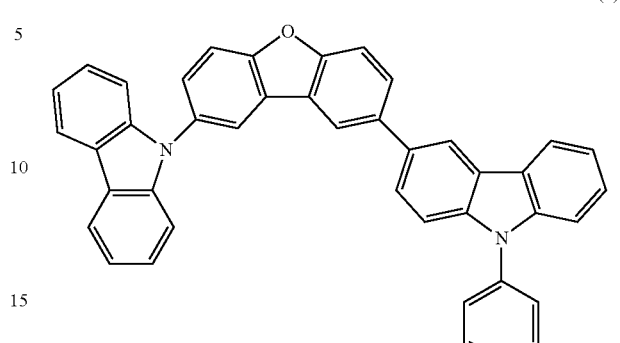

H-A (1)

[Chem 2]

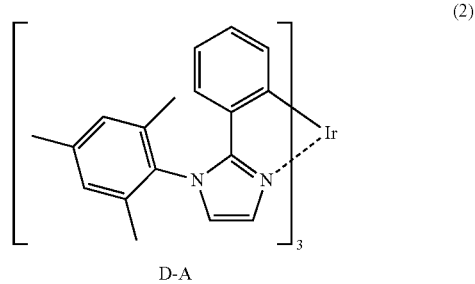

D-A (2)

[Chem 3]

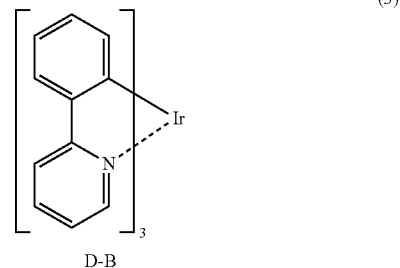

D-B (3)

[Chem 4]

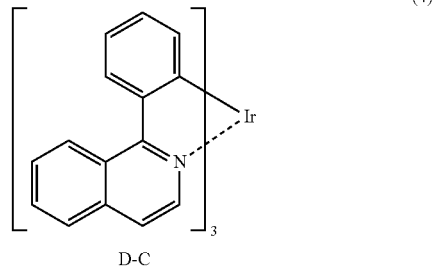

D-C (4)

Subsequently, a coating liquid for an electron transport layer having a composition described below was prepared, and the coating liquid for an electron transport layer was coated on the light-emitting layer 35 by a spin coater under conditions of 1500 rpm for 30 seconds. Then, the element substrate 31 on which the coating liquid for an electron transport layer had been coated, was heated and dried for 30 minutes under an environment giving the substrate surface temperature of 120° C. and thus the electron transport layer 36 was formed. Meanwhile, when an electron transport layer was formed by coating the coating liquid for an electron transport layer on a substrate prepared separately under the same conditions as the above-described coating conditions of the coating liquid for an electron transport layer and the thickness thereof was measured, the thickness was 30 nm.

(Coating Liquid for an Electron Transport Layer)
2,2,3,3-tetrafluoro-1-propanol: 100 g
Electron-transport material (ET-A): 0.75 g Meanwhile, the electron-transport material (ET-A) contained in the above-described coating liquid for an electron transport layer is a carbazole derivative, and is shown by the structural formula (5) below.

[Chem 5]

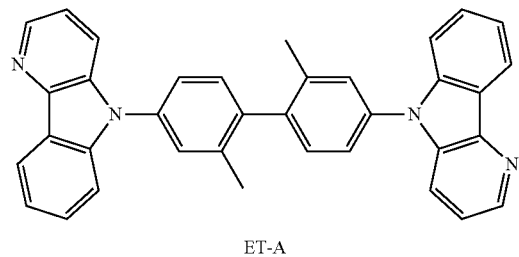

(5)

ET-A

Subsequently, the element substrate 31 on which respective layers up to the electron transport layer 36 had been formed, was moved to an evaporation apparatus without air exposure, and after that, the pressure inside the evaporation apparatus was reduced to $4\times10^{-4}$ Pa. Meanwhile, before the pressure reduction, previously, potassium fluoride and aluminum were placed, respectively, in resistance heating boats made of tantalum and the resistance heating boats were mounted on the evaporation apparatus.

Subsequently, energization of the resistance heating boat containing potassium fluoride was carried out to heat the resistance heating boat. Consequently, by evaporation of potassium fluoride, the electron injection layer 37 having a thickness of 3 nm was formed on the electron transport layer 36.

Subsequently, energization of the resistance heating boat containing aluminum was carried out to heat the resistance heating boat. Consequently, by evaporation of aluminum at an evaporation rate of 1 to 2 nm/sec, the cathode 38 having a thickness of 100 nm was formed on the electron injection layer 37.

Here, in this way, the organic EL element main body 30 was produced. After that, the sealant was provided on the surface of the organic EL element main body 30 on the cathode 38 side. Then, finally, any of the above-mentioned first to eighth light extraction sheets was stuck to the light extraction surface of the element substrate 31 (the surface on the side opposite to the anode 32 side) via an adhesive agent, and organic EL elements in various Examples and various Comparative Examples described below were produced.

Example 1

(1) Configuration of Organic EL Element
(Examples 1-1 to 1-6)

In Example 1, organic EL elements (Examples 1-1 to 1-6) were produced using each of the fourth to ninth light extraction sheets.

In addition, in the example, in order to make comparisons with organic EL elements of Examples 1-1 to 1-6, an organic EL element not provided with a light extraction sheet (Comparative Example 1-1) was produced. Furthermore, as Comparative Examples, organic EL elements (Comparative Examples 1-2 to 1-4) were produced using each of the first to third light extraction sheets.

(2) Characteristic Evaluation

In Example 1, for each of organic EL elements in Examples 1-1 to 1-6 and Comparative Examples 1-1 to 1-4 produced as mentioned above, the following luminance characteristic evaluation was carried out.

In the luminance characteristic evaluation, first, the luminance when a DC constant current of 2.5 mA/cm² was flown to each of organic EL elements immediately after the production (initial luminance) was measured using a spectral radiance meter CS-2000 (manufactured by Konica Minolta Sensing). Then, light extraction efficiency was calculated on the basis of the measured luminance. Meanwhile, the light extraction efficiency was defined as a ratio of the luminance of the organic EL element provided with the light extraction sheet (Example 1-1 to 1-6 and Comparative Example 1-2 to 1-4), to the luminance of the organic EL element not provided with the light extraction sheet (Comparative Example 1-1).

Furthermore, in the luminance characteristic evaluation in the example, luminance (luminance after high temperature and high humidity) was measured (weathering test) in the same way as mentioned above, after letting each of the organic EL elements in Examples 1-1 to 1-6 and Comparative Examples 1-1 to 1-4 stand in a constant humidity and temperature chamber having a temperature of 60° C. and a relative humidity of 90% for 100 hours.

Moreover, in the luminance characteristic evaluation in the example, a rate of decrease in luminance was calculated from the luminance before placing the organic EL element in the constant humidity and temperature chamber (initial luminance) and the luminance after the placing (luminance after high temperature and humidity). Specifically, the rate of decrease in luminance was calculated on the basis of a calculation formula: [luminance after the placing/luminance before the placing]×100(%).

In addition, in the characteristic evaluation in Example 1, the presence or absence of yellowing was examined in terms of light extraction sheets of the respective organic EL elements in Examples 1-1 to 1-6 and Comparative Examples 1-1 to 1-4. Specifically, after the weathering test mentioned above, the surface of the organic EL element on the light extraction sheet side was observed visually in a non-emitting state, and the presence or absence of yellowing was evaluated on the basis of two levels ("OK" evaluation or "NG" evaluation to be mentioned later).

In FIG. 5, results of various evaluations mentioned above are shown. Meanwhile, in FIG. 5, in addition to the evaluation results, configurations of element substrates and light extraction sheets of the respective organic EL elements are described together. In addition, the standard of "OK" evaluation and "NG" evaluation showing the presence or absence of yellowing in FIG. 5 is as follows.

OK: yellowing cannot be recognized.
NG: yellowing is clearly recognized.

As is clear from the evaluation results shown in FIG. 5, in all the items of luminance characteristics (luminance (initial luminance), light extraction efficiency, luminance after high temperature and humidity and rate of decrease in luminance), the respective organic EL elements in Examples 1-1 to 1-6 gave characteristics that were equal to or more preferable than those of organic EL elements in Comparative Examples 1-1 to 1-4.

In addition, yellowing was observed in Comparative Examples 1-2 to 1-4, but no yellowing was observed in Examples 1-1 to 1-6. Meanwhile, yellowing is not observed in the organic EL element of Comparative Example 1-1 not provided with the light extraction sheet, but luminance (initial luminance), light extraction efficiency and luminance after high temperature and humidity are inferior to those of other organic EL elements.

From the evaluation results in Example 1, it was found that the use of the fourth to ninth light extraction sheets (sample numbers 4 to 9 in FIG. 5) as the light extraction sheet gave the organic EL element that did not show yellowing and was excellent in luminance characteristics. That is, it was found that the organic EL element excellent in both the light extraction efficiency and light resistance was able to be obtained by providing the light extraction sheet in which at least a silicon compound is added in the light diffusion layer, the haze value is about 90 or more and the value of the total light transmittance is about 80% or more on the light extraction surface of the organic EL element.

Example 2

(1) Configuration of Organic EL Element (Examples 2-1 to 2-6)

In Example 2, organic EL elements (Examples 2-1 to 2-6) were produced by changing variously the formation material of the element substrate 31. Meanwhile, in the organic EL elements in Example 2, configurations other than that of the element substrate 31 were set to be the same as the corresponding configurations of the organic EL elements in Example 1-5. That is, in Example 2, the eighth light extraction sheet (sample number 8 of light extraction sheet), in which a concave-convex pattern was formed on the light extraction surface, was used as the light extraction sheet.

The element substrate 31 used in each of Examples 2-1 to 2-6 is as follows. In the organic EL element in Example 2-1, a PEN (polyethylene naphthalate) film having a thickness of 200 µm was used as the element substrate 31. In the organic EL element in Example 2-2, a PET (polyethylene terephthalate) film having a thickness of 200 µm was used as the element substrate 31. In the organic EL element in Example 2-3, a polyimide film having a thickness of 200 µm was used as the element substrate 31.

Furthermore, in the organic EL element in Example 2-4, a glass substrate having a thickness of 0.4 mm, that is, thin film glass was used as the element substrate 31. In the organic EL element in Example 2-5, a glass substrate having a thickness of 0.2 mm (thin film glass) was used as the element substrate 31. In addition, in the organic EL element in Example 2-6, a metal foil substrate, in which a polyimide layer (insulating layer) having a thickness of 30 µm was provided on both surfaces of an aluminum foil having a thickness of 90 µm, was used as the element substrate 31.

Meanwhile, in the example, an organic EL element (Comparative Example 2-1) obtained by replacing the element substrate of the organic EL element in the Comparative Example 1-1 (without light extraction sheet) with a PEN film having a thickness of 200 µm, was produced for comparison. In addition, an organic EL element (Comparative Example 2-2) obtained by sticking the first light extraction sheet (sample number 1 of light extraction sheet) on the light extraction surface of the organic EL element of the Comparative Example 2-1, was also produced. Furthermore, an organic EL element (Comparative Example 2-3) obtained by replacing the element substrate in the organic EL element of the Comparative Example 2-1 with a PET film having a thickness of 200 µm, was produced.

(2) Characteristic Evaluation

In Example 2, for respective organic EL elements of Examples 2-1 to 2-6 and Comparative Examples 2-1 to 2-3, luminance characteristics and the presence or absence of yellowing were evaluated in the same way as in Example 1. Meanwhile, the evaluation standard of the presence or absence of yellowing was the same as the evaluation standard in Example 1.

In the example, the light extraction efficiencies of the respective samples were calculated as follows. For the samples of Comparative Examples 2-1 and 2-2, the light extraction efficiency was obtained using the luminance of Comparative Example 2-1 (=550) as the standard (light extraction efficiency=1.00). For the respective samples of Examples 2-1 to 2-6 and Comparative Example 2-3, although the explanation is omitted here, each of organic EL elements having a configuration not provided with the light extraction sheet corresponding to every sample (every element substrate) was produced, and the light extraction efficiencies of the respective samples were obtained on the basis of the luminance of the produced organic EL element not provided with the light extraction sheet.

In FIG. 6, the evaluation result is shown. Meanwhile, in FIG. 6, the evaluation results of the organic EL element in the above-mentioned Example 1-5 are also described together.

As is clear from FIG. 6, it was found that, when there is used the light extraction sheet having at least a silicon compound added in the light diffusion layer, a haze value of about 90 or more and the total light transmittance value of about 80% or more, the organic EL element not exhibiting yellowing and excellent in luminance characteristics is obtained even by using any of PEN, PET, polyimide, glass and metal foil as the formation material of the element substrate 31. Furthermore, it was found that, when the light extraction sheet satisfying the above-described configuration conditions is used and a glass substrate is used as the element substrate 31, excellent emission properties are obtained irrespective of the thickness of the element substrate 31 (glass substrate).

Example 3

In Example 3, for the respective organic EL elements in Example 1-5, Examples 2-1 to 2-6 and Comparative Examples 2-1 to 2-3, a glow wire heat resistance test was carried out in accordance with a technique described in JIS C8105-1 to examine flame retardance of the respective organic EL elements.

In FIG. 7, the evaluation results are shown. Meanwhile, the standard of "OK" evaluation and "NG" evaluation of flame retardance shown in FIG. 7 is as follows.

OK: fire was extinguished within a period shorter than 30 seconds after separation of a glow wire from the organic EL element NG: fire was not extinguished even beyond 30 seconds after separation of a glow wire from the organic EL element As is clear from FIG. 7, when there is used the light extraction sheet, which has at least a silicon compound added in the light diffusion layer, has a haze value of about 90 or more and has the total light transmittance value of about 80% or more, it was found that the organic EL element excellent also in flame retardance in addition to the light extraction efficiency and weather resistance, is obtained.

Meanwhile, although not having been shown specifically in the various Examples, the same evaluations as those in various Examples were carried out also in the case where the base material of the light extraction sheet was constituted of a fluororesin-containing film. As a result, also when the base material of the light extraction sheet was constituted of a fluororesin-containing film, the same evaluation results as in various Examples were obtained.

REFERENCE SIGNS LIST

1: organic EL element main body, 2: light extraction sheet, 2a: base material, 2b: light diffusion layer, 3: sealant, 10: organic EL element, 11: element substrate, 12: anode, 13: organic compound layer, 14: cathode, 20: planar light-emitting body, 21: support substrate, 22: adhesion member

The invention claimed is:

1. An organic electroluminescence element, comprising:
    an organic electroluminescence element main body having an element substrate, a first electrode formed on the element substrate, an organic compound layer that is formed on the first electrode and includes a light-emitting layer, and a second electrode formed on the organic compound layer; and
    a light extraction sheet provided on a light-extraction side of the organic electroluminescence element main body, wherein
    the light extraction sheet contains a silicon compound, a binder, and a bromine-containing compound, and
    a haze value of the light extraction sheet measured by a method specified in ISO 14782 released in 1999 is 90% or more, and a value of a total light transmittance of the light extraction sheet measured by a method specified in ISO 13486-1 released in 1996 is 80% or more.

2. The organic electroluminescence element according to claim 1, wherein
    the light extraction sheet has a base material and the base material is any of a polycarbonate film, a polyethylene terephthalate film, a polyethylene naphthalate film, a polyimide film, and a fluororesin-containing film.

3. The organic electroluminescence element according to claim 1, wherein
    the light extraction sheet further contains a polyacrylic acid ester resin.

4. The organic electroluminescence element according to claim 1, wherein
    a prescribed concave-convex pattern is formed on a light extraction surface of the light extraction sheet.

5. The organic electroluminescence element according to claim 1, wherein
    the element substrate is a glass film.

6. The organic electroluminescence element according to claim 1, wherein the element substrate is a polyimide film.

7. The organic electroluminescence element according to claim 1, wherein the content of the bromine-containing compound is 1-50 parts by weight with respect to the binder.

8. The organic electroluminescence element according to claim 1, wherein the binder is a resin.

9. The organic electroluminescence element according to claim 8, wherein the resin is a polyacrylic acid ester resin.

* * * * *